United States Patent
Zheng et al.

(10) Patent No.: US 6,638,644 B2
(45) Date of Patent: Oct. 28, 2003

(54) ELECTROLUMINESCENT DEVICES HAVING DIARYLANTHRACENE POLYMERS

(75) Inventors: Shiying Zheng, Webster, NY (US); Jianmin Shi, Webster, NY (US); Kathleen M. Vaeth, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 19 days.

(21) Appl. No.: 09/941,120

(22) Filed: Aug. 28, 2001

(65) Prior Publication Data

US 2003/0082402 A1 May 1, 2003

(51) Int. Cl.$^7$ ................................. H05B 33/14
(52) U.S. Cl. ...................... 428/690; 428/917; 313/504; 313/506
(58) Field of Search ................ 428/690, 917; 313/502, 504, 506; 257/40, 103

(56) References Cited

U.S. PATENT DOCUMENTS

| | | | |
|---|---|---|---|
| 4,356,429 A | 10/1982 | Tang | 313/503 |
| 4,769,292 A | 9/1988 | Tang et al. | 428/690 |
| 5,429,884 A | 7/1995 | Namiki et al. | 428/690 |
| 5,776,622 A | 7/1998 | Hung et al. | 428/690 |
| 5,777,070 A | 7/1998 | Inbasekaran et al. | 528/394 |
| 5,935,721 A | 8/1999 | Shi et al. | 428/690 |
| 5,972,247 A | 10/1999 | Shi et al. | 252/583 |

FOREIGN PATENT DOCUMENTS

EP   0 681 019   11/1995

OTHER PUBLICATIONS

"Synthesis and characterization of soluble, photoluninescent polyamides, polyesters and polyesters containing 9,10–di(4–biphenyl)anthracene segments in the main chain", J.A. Mikroyannidis, Polymer, vol. 41 (2000), pp. 8193–8204.*

"Electroluminescence from the New Polynorbornenes That Contain Blue–Light–Emitting and Charge–Transport Side Chains", Boyd et al., Macromolecules, 1997, vol. 30, pp. 3553–3559.*

Burroughes et al, Light–emitting diodes based on conjugated polymers, Nature, vol. 347, 1990, pp. 539–541.

Ohmori et al, Blue Electroluminescent Diodes Utilizing Poly(alkylfluorene), Jap. Jour. of Applied Physics, vol. 30, No. 11B, 1991, pp. L1941–L1943.

Grem et al, Realization of a Blue–Light–Emitting Device using Poly(p–phenylene), Advanced Materials, 4 (1992) No. 1, pp. 36–37.

Groenendaal et al, Poly(3,4–ethylenedioxythiophene) and Its Derivatives: Past, Present, and Future, Advanced Materials 2000, 12, No. 7, pp. 481–494.

Ohmori et al, Effects of Alkyl Chain Length and Carrier Confinement Layer on Characteristices of Poly(3–Alkylthiophene) Electroluminescent Diodes, Solid State Comm. vol. 80, No. 8, 1991, pp. 605–608.

* cited by examiner

Primary Examiner—Cynthia H. Kelly
Assistant Examiner—Dawn Garrett
(74) Attorney, Agent, or Firm—Raymond L. Owens

(57) ABSTRACT

An electroluminescent device comprises an anode, a cathode, and an emissive layer having a polymer luminescent material disposed between the anode and cathode, the polymer luminescent material includes diarylanthracene-based conjugated polymer having a repeating unit of the following formula:

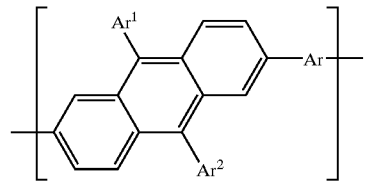

wherein:

$Ar^1$, $Ar^2$, and Ar are each individually aryl or substituted aryl of from 6 to 40 carbon atoms; or $Ar^1$, $Ar^2$, and Ar are each individually substituted heteroaryl or unsubstituted heteroaryl having 4 to 40 carbons.

14 Claims, 4 Drawing Sheets

| 4000 |
|------|
| 3000 |
| 2000 |
| 1000 |

FIG 3

ELECTROLUMINESCENT DEVICES HAVING DIARYLANTHRACENE POLYMERS

CROSS REFERENCE TO RELATED APPLICATION

Reference is made to commonly-assigned U.S. Ser. No. 09/941,009 filed herewith, entitled "Electroluminescent Devices Having Diarylanthracene Ladder Polymers in Emissive Layers" by Zheng et al the disclosure of which is incorporated herein.

FIELD OF THE INVENTION

The present invention relates to electroluminescent (EL) devices having diarylanthracene polymers.

BACKGROUND OF THE INVENTION

Electroluminescent (EL) devices such as light emitting diode (LED) are opto-electronic devices which radiate light on the application of an electrical field. Organic materials including both polymers and small molecules have been used to fabricate LEDs. LEDs fabricated from these materials offer several advantages over other technologies, such as simpler manufacturing, low operating voltages, and the possibility of producing large area and full-color displays. Organic polymers generally offer significant processing advantages over small molecules especially for large area EL display because polymer films can be easily produced by casting from solution.

Conjugated polymers are a class of polymers that possess an extended π-bond network along polymer main chain. Their electronic states can delocalize caused by the effect of the electron-lattice and electron—electron interactions. Conjugated polymers such as poly(phenylvinylene) (PPV) were first introduced as EL materials by Burroughes et al. in 1990 (Burroughes, J. H. Nature 1990, 347, 539–41). To improve the polymer solubility, dialkoxy-substituted PPV such as poly(2,5-dialkoxy-p-phenylenevinylene) and MEH-PPV, poly[2-methoxy-5-(2'-ethyl-hexoxyl)-p-phenylenevinylene] have been developed. EL efficiency has been improved by balanced electron-hole injection and recombination of the charge carriers. Other conjugated polymers such as polydialkylfluorene (PF) (Ohmori, Y. et al *Jpn. J. Appl. Phys. Part 2* 1991, 20, L1941–L1943), poly(p-phenylene) (PPP) (Grem, G. et al *Adv. Mater.* 1992, 4, 36–7), and poly(thiophene) (Ohmori, Y. et al *Solid State Commun.* 1991, 80, 605) have also been studied.

The light-emitting layer of an EL device comprises a highly luminescent material where electroluminescence is produced as a result of electron-hole pair recombination in this region. In order to achieve efficient light output the efficient and highly fluorescent materials are required. 9,10-Diaryl substituted anthracenes are well known for their high fluorescence efficiency. The highly efficient light output and high operational stability of EL devices have been disclosed in commonly assigned U.S. Pat. Nos. 5,935,721 and 5,972,247 by using substituted anthracenes as light-emitting materials.

SUMMARY OF THE INVENTION

It is an object of the present invention to provide luminescent polymeric materials useful for polymer EL devices.

It is a further object of the present invention to provide various energy bandgap luminescent polymers which emit broad range of color.

A new class of anthracene-based polymers has been discovered for use in electroluminescent devices.

These objects are achieved in an electroluminescent device comprises an anode, a cathode, and an emissive layer having a polymer luminescent material disposed between the anode and cathode, the polymer luminescent material includes diarylanthracene-based conjugated polymer having a repeating unit of the following formula:

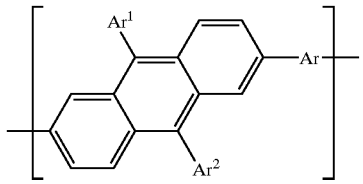

wherein:
Ar$^1$, Ar$^2$, and Ar are each individually aryl or substituted aryl of from 6 to 40 carbon atoms; or
Ar$^1$, Ar$^2$, and Ar are each individually substituted heteroaryl or unsubstituted heteroaryl having 4 to 40 carbons.

The present invention provides light-emitting materials with a number of advantages that include good solubility, efficiency and stability. The emitting color of the polymer can be easily tuned by the incorporation of desired Ar group. Furthermore, other electro-optical properties can also be tuned with Ar group. The materials from the present invention can also be used as host materials for other light emitting materials.

BRIEF DESCRIPTION OF THE DRAWINGS

FIG. 3 illustrates a cross-section of a single-layer EL device which can use a polymer in accordance with the present invention;

DETAILED DESCRIPTION OF THE INVENTION

Figure 1:
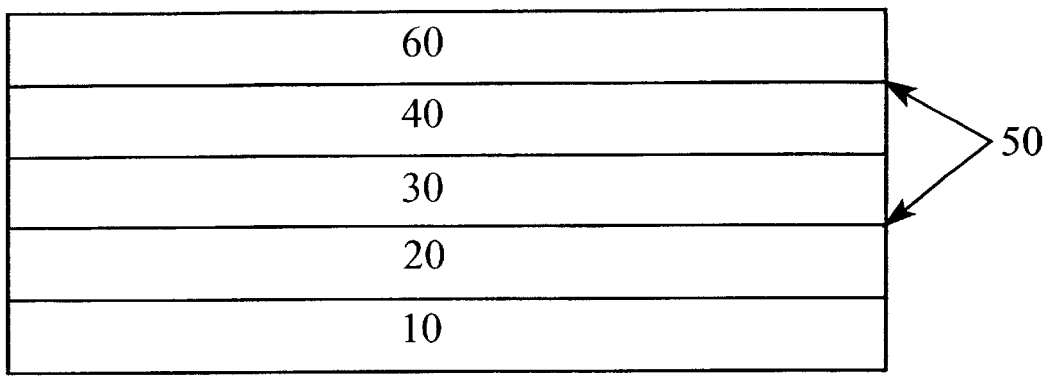
FIG. 1 illustrates in cross-section a bi-layer EL device which can use a polymer in accordance with the present invention.

The present invention provides light emitting polymers containing diarylanthracene with good solubility and thermal stability as shown in formula I. The rigid chromophore in the polymer main chain increases the rigidity of the polymer backbone and improves thermal properties. Polymers containing such chromophore are highly fluorescent and efficient light emitting materials. Incorporation of the Ar group has the following features:
1) to further improve solubility of the polymer;
2) to achieve balanced electron-hole injection and recombination of the charge carriers;
3) to improve electron or hole transporting ability; and
4) to improve the emitting hue of the polymer.

The polymer shown in formula I is a homopolymer or a copolymer containing a diarylanthracene repeating unit.

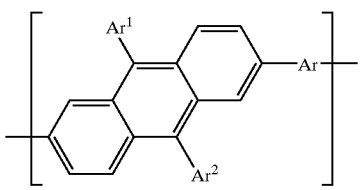

(I)

wherein:

Ar¹, Ar², and Ar are each individually aryl or substituted aryl of from 6 to 40 carbon atoms; or Ar¹, Ar², and Ar are each individually substituted heteroaryl or unsubstituted heteroaryl having 4 to 40 carbons;

For example, Ar¹ and Ar² individually represent

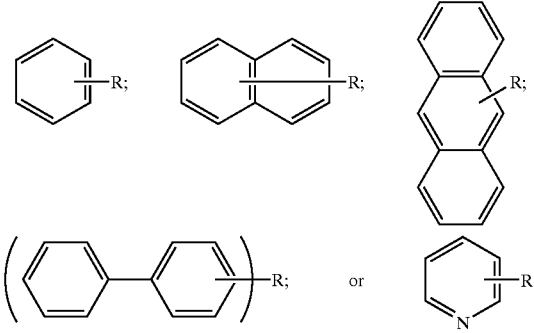

wherein: R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

Ar represents the following groups:

Group 1:

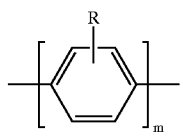

wherein: R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom; and m is an integer from 1 to 3;

Group 2:

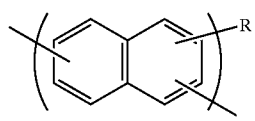

Group 3:

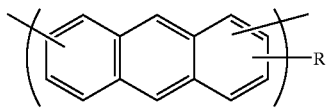

Group 4:

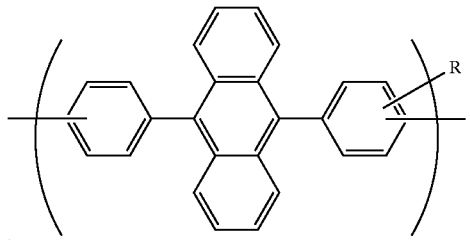

Group 5:

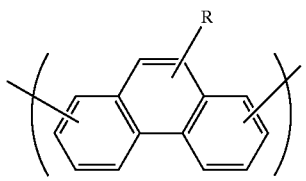

Group 6:

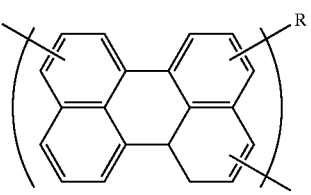

Group 7:

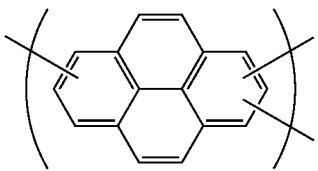

Group 8:

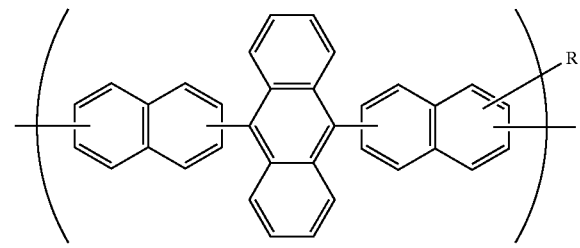

Group 9:

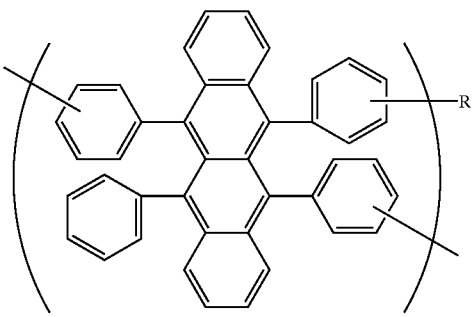

Group 10:

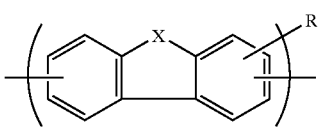

wherein: X is an O or S atom;

Group 11:

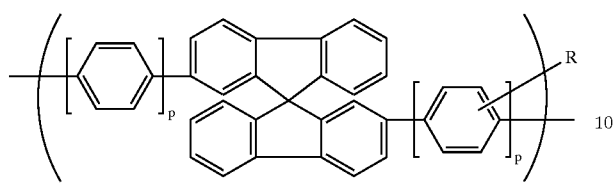

wherein: p is an integer from 0 to 2;

Group 12:

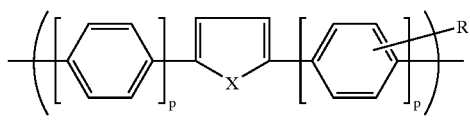

Group 13:

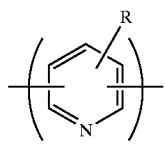

Group 14:

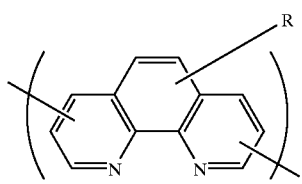

Group 15:

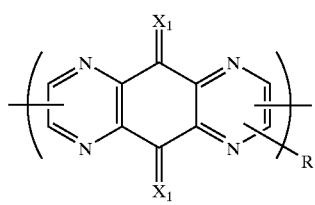

wherein: $X_1$ is an O atom or two cyano groups;

Group 16:

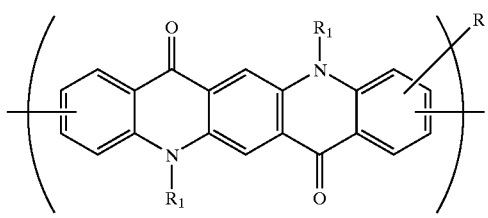

wherein: $R_1$ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons;

Group 17:

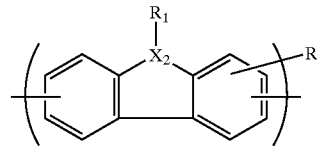

wherein: $X_2$ is a nitrogen or carbon atom;

Group 18:

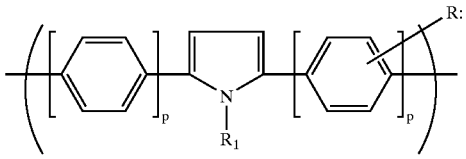

Group 19:

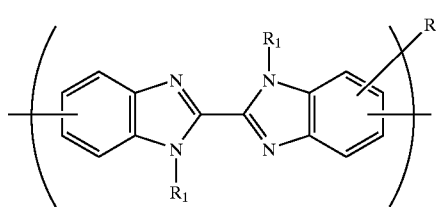

Group 20:

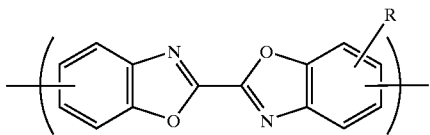

Group 21:

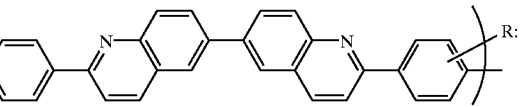

Group 22:

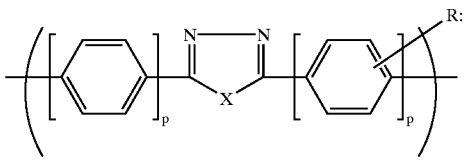

Group 23:

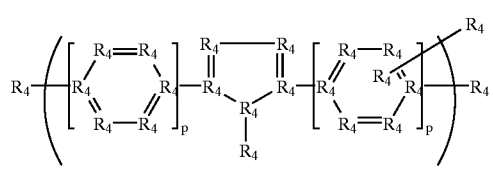

Group 24:

wherein: $R_1$ is defined as above, and p is an integer from 0 to 2.

Group 25:

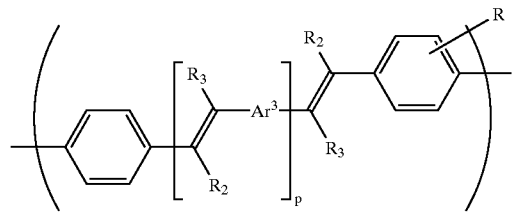

wherein: $Ar^3$ is defined as Ar; $R_2$ and $R_3$ are each independently hydrogen, alkyl group of from 1 to 24 carbon atoms, or aryl or substituted aryl of from 6 to 28 atoms, or heteroaryl or substituted heteroaryl of from 4 to 40 atoms, or a cyano group. Preferably, $R_2$ and $R_3$ are hydrogen, or a cyano group; p is an integer from 0 to 2.

The following molecular structures constitute specific examples of preferred polymers satisfying the requirement of this invention:

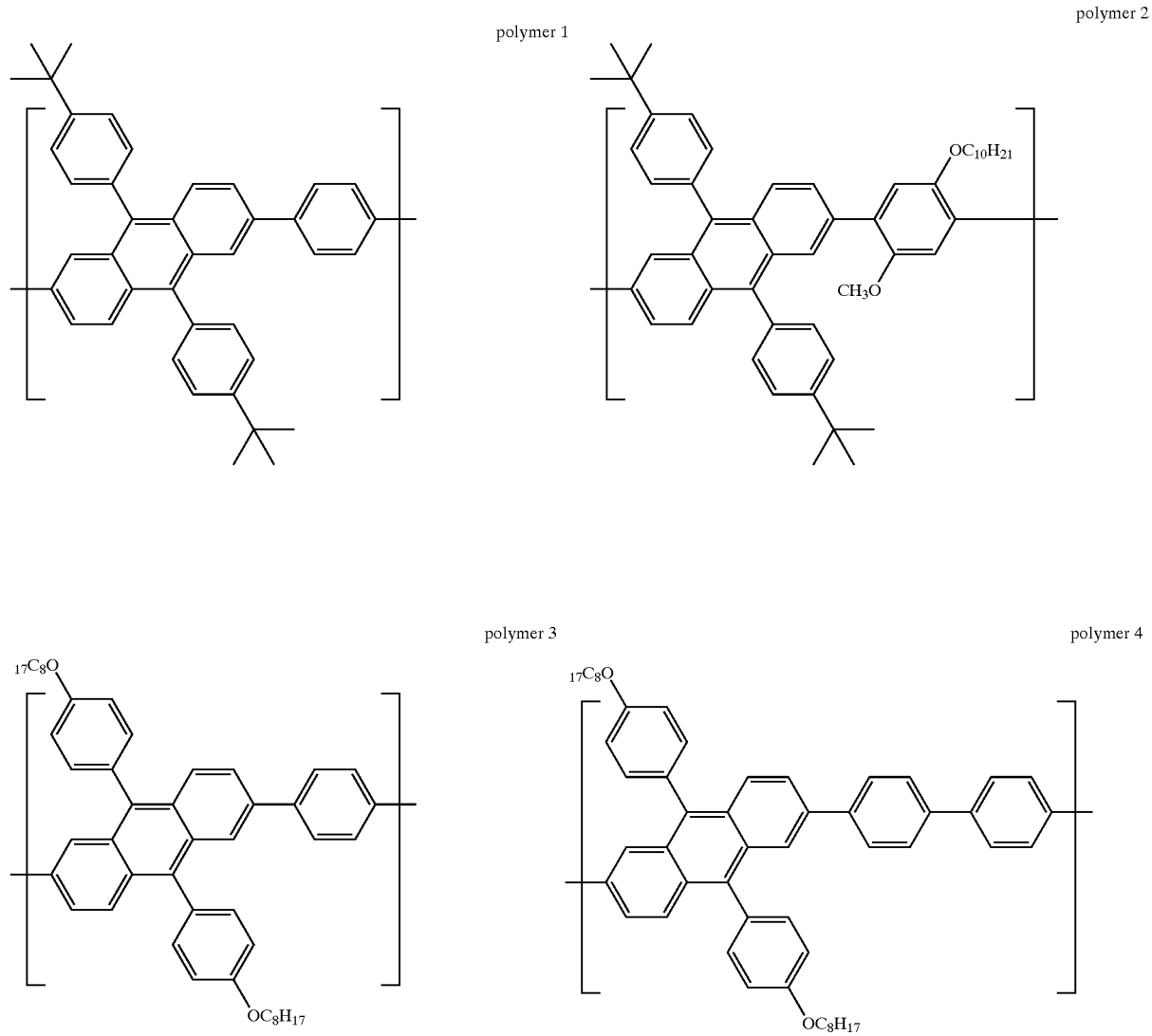

-continued
polymer 5
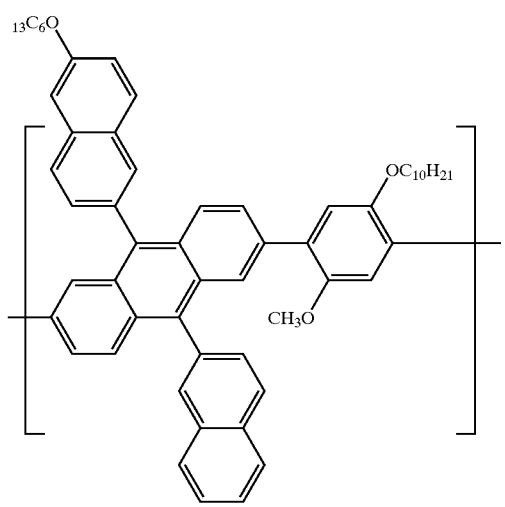
polymer 6
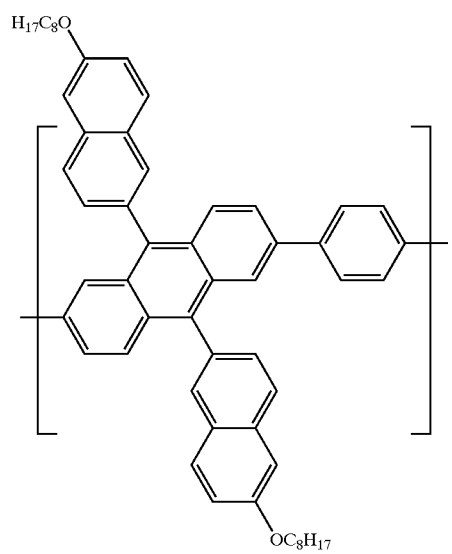
polymer 7
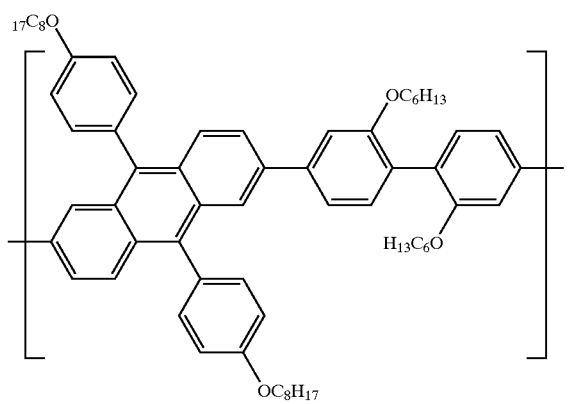
polymer 8
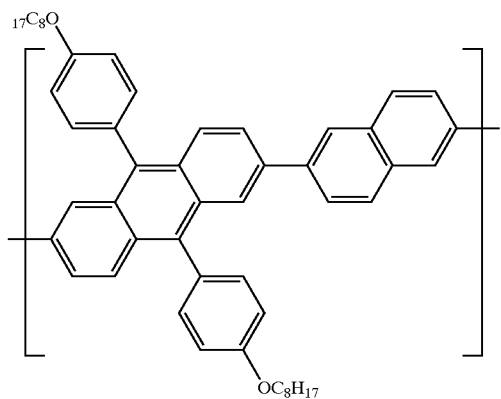
polymer 9
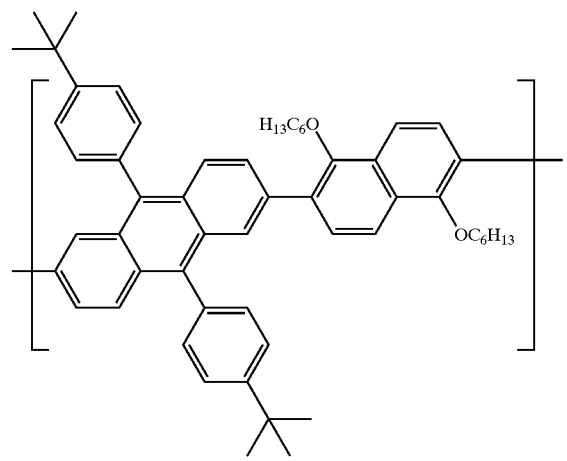

-continued
polymer 10
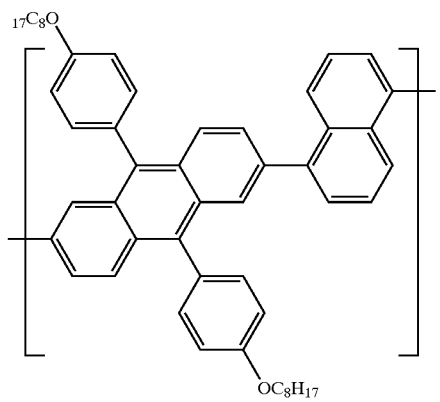
polymer 11
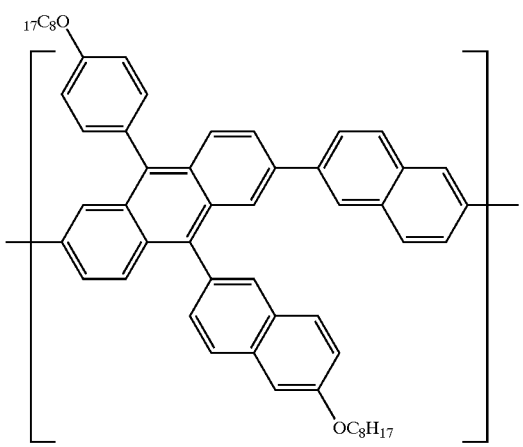
polymer 12
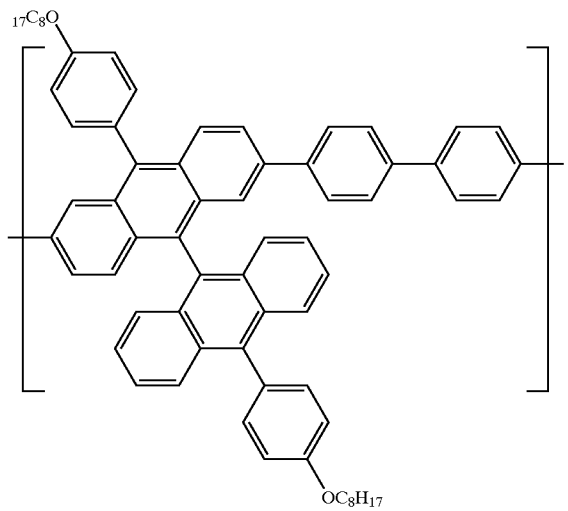
polymer 13
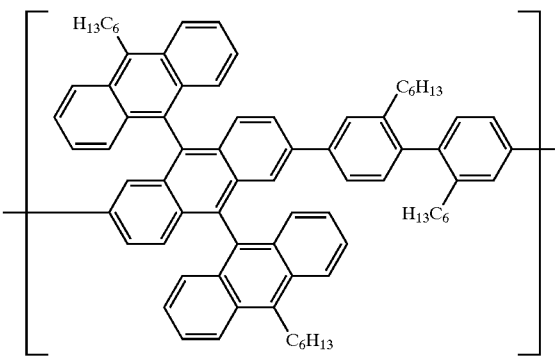
polymwr 14
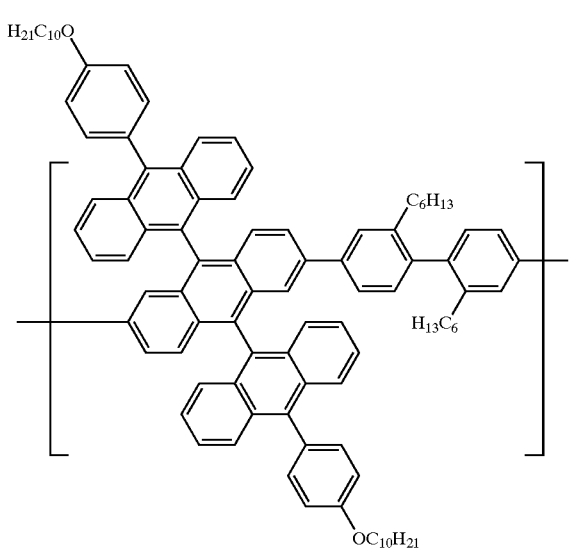

-continued
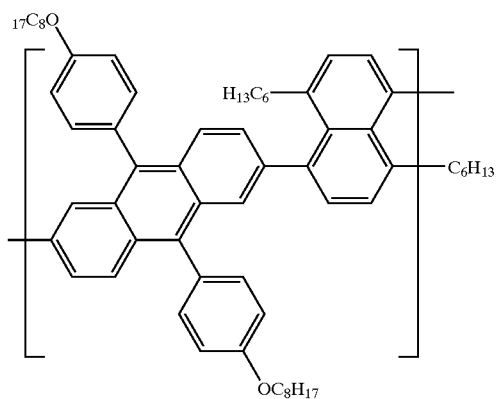
polymer 15
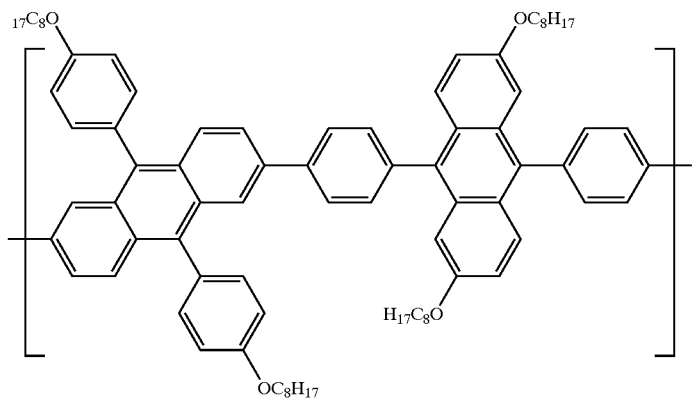
polymer 16
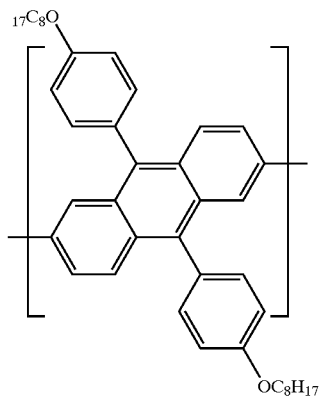
polymer 17
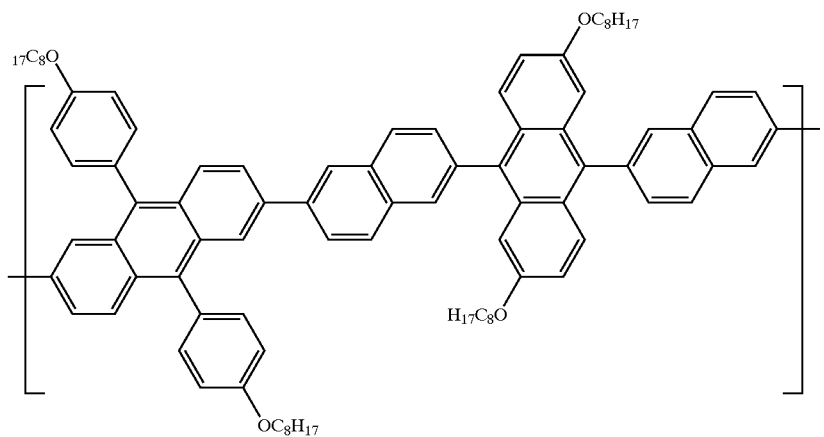
polymer 18

-continued
polymer 19
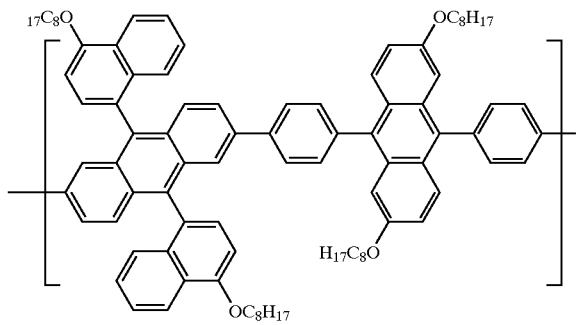
polymer 20
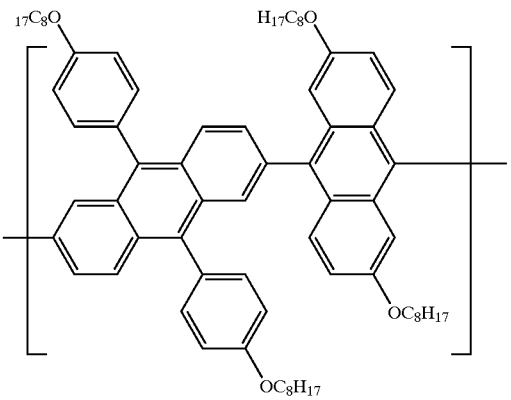
polymer 21
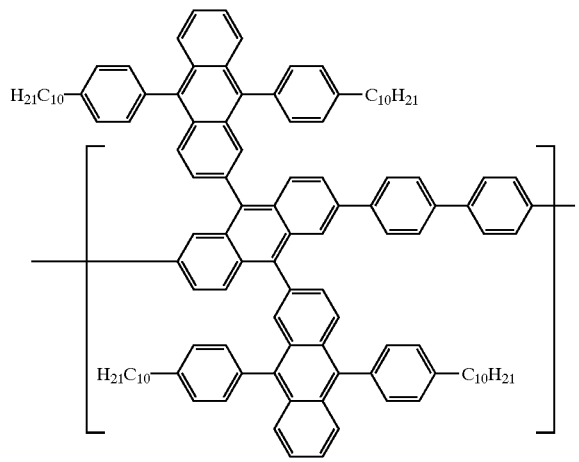
polymer 22
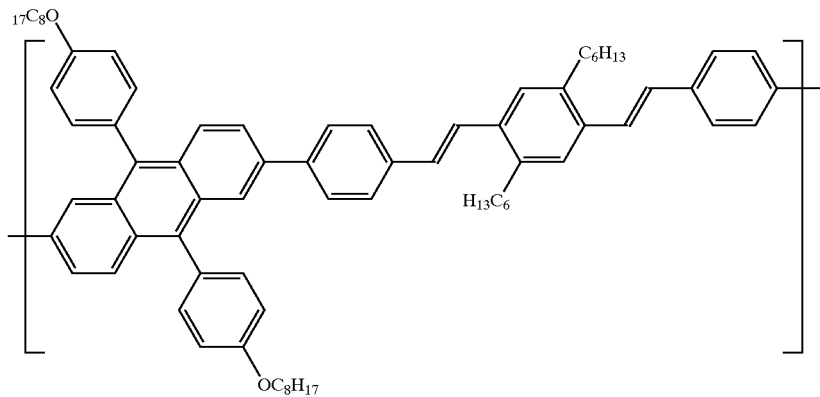

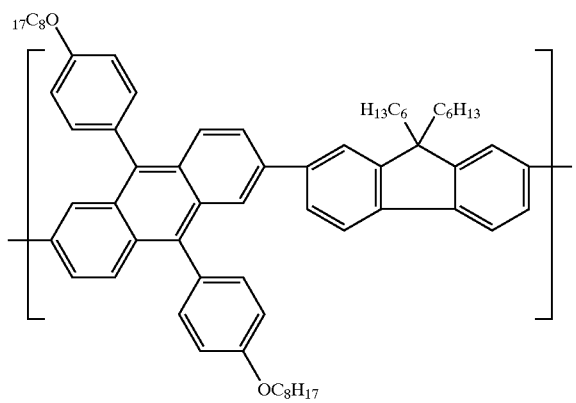
polymer 23
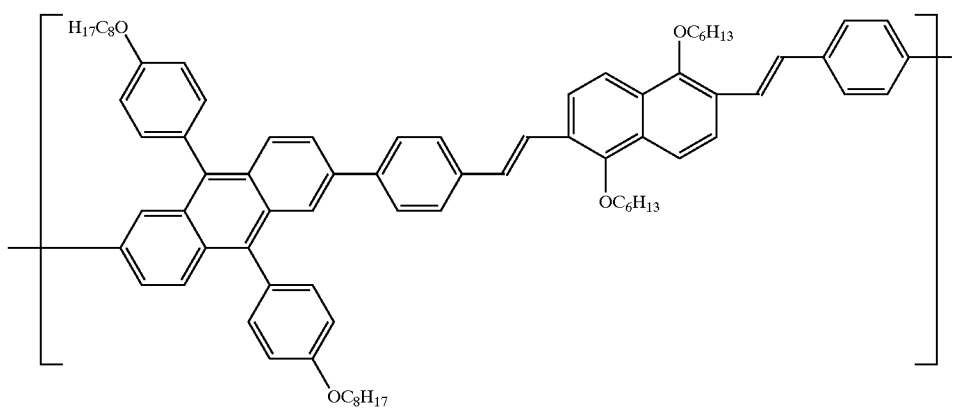
polymer 24
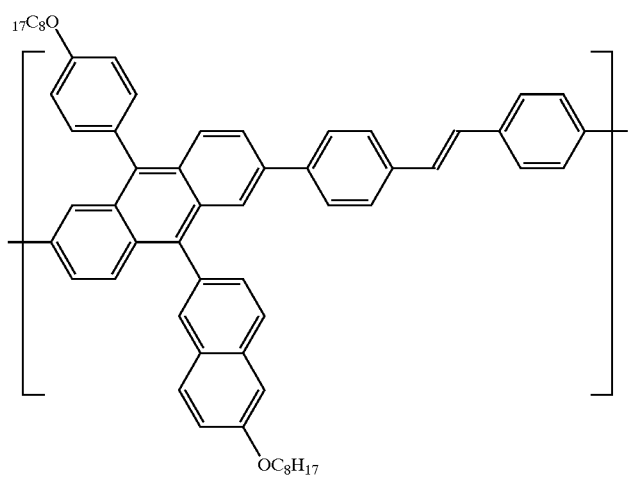
polymer 25

-continued
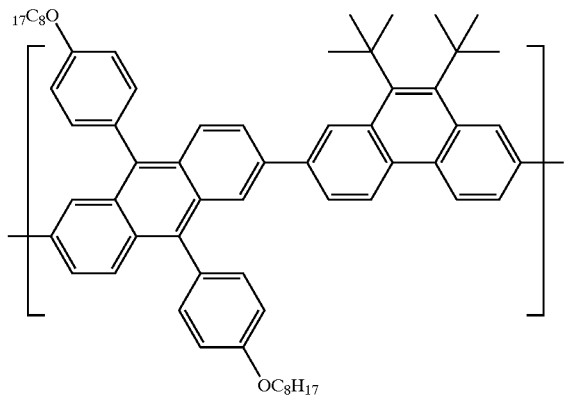
polymer 26
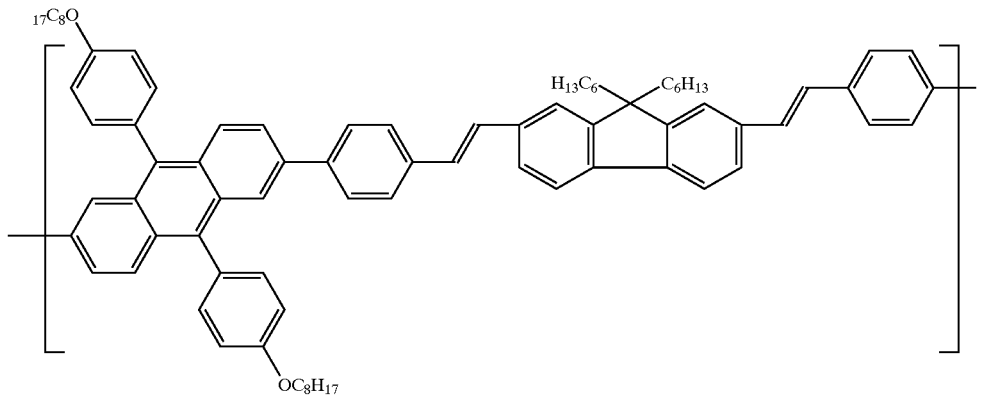
polymer 27
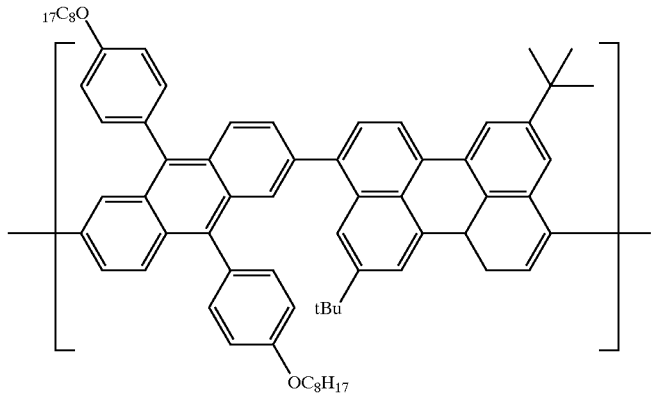
polymer 28
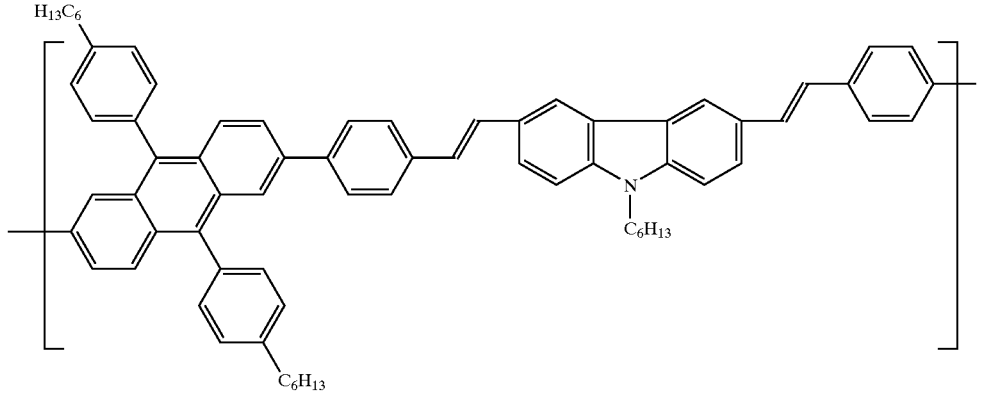
polymer 29

-continued
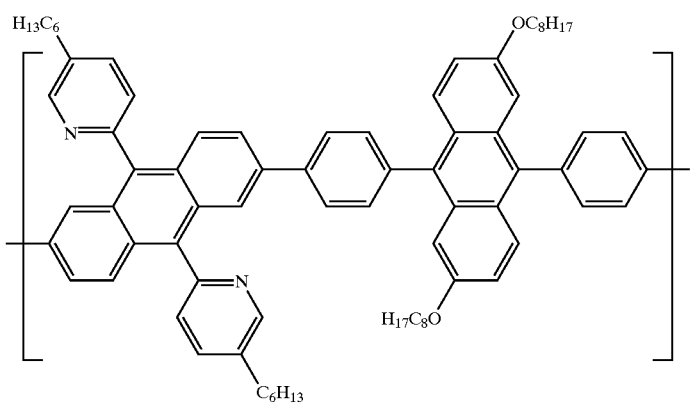
polymer 30
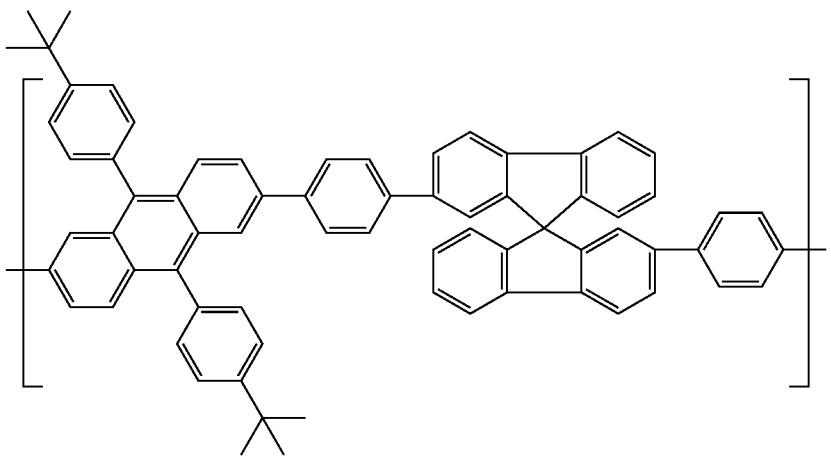
polymer 31
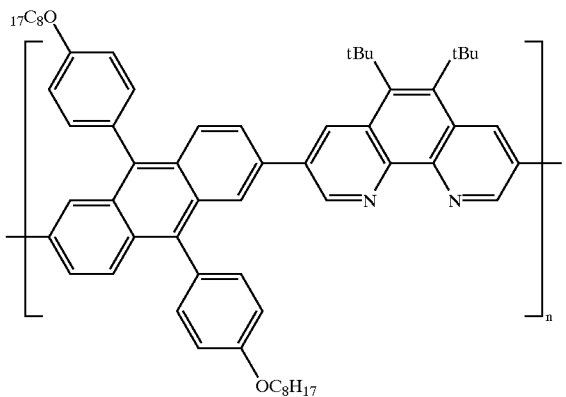
polymer 32
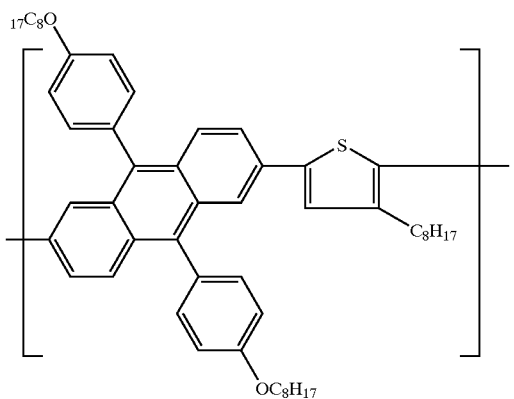
polymer 33 polymer 34
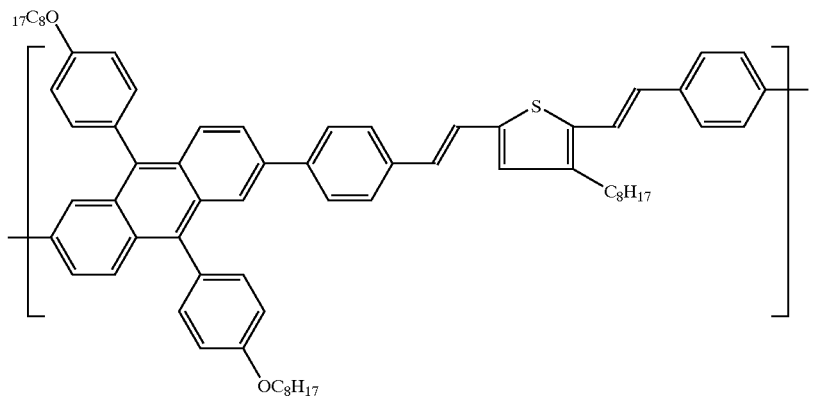
polymer 35
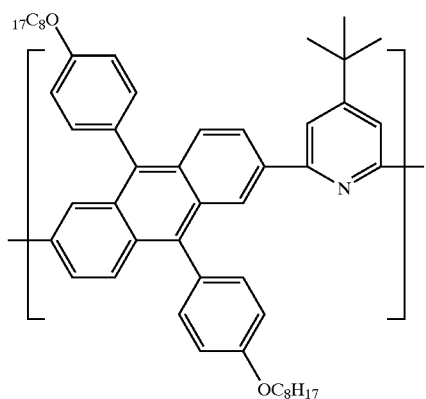
polymer 36
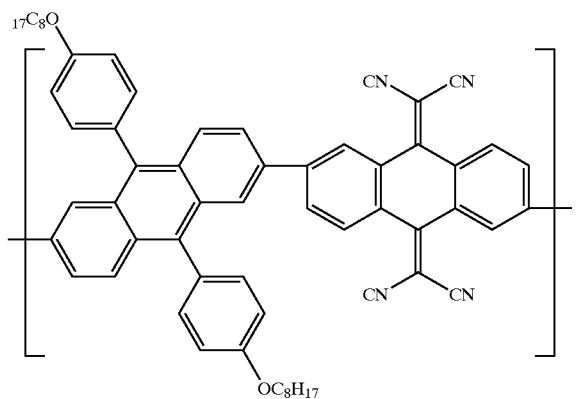
polymer 37
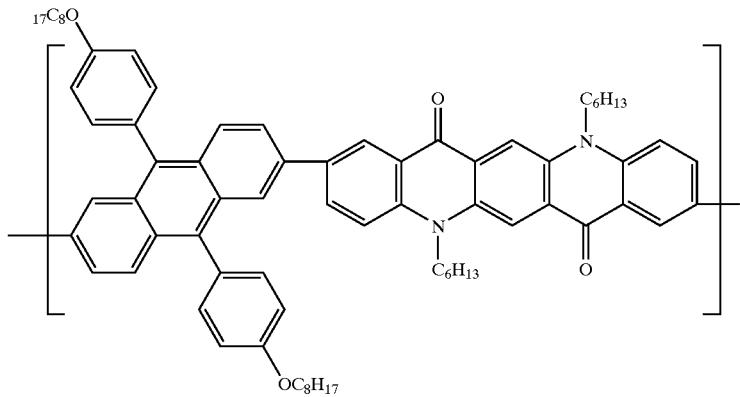

-continued
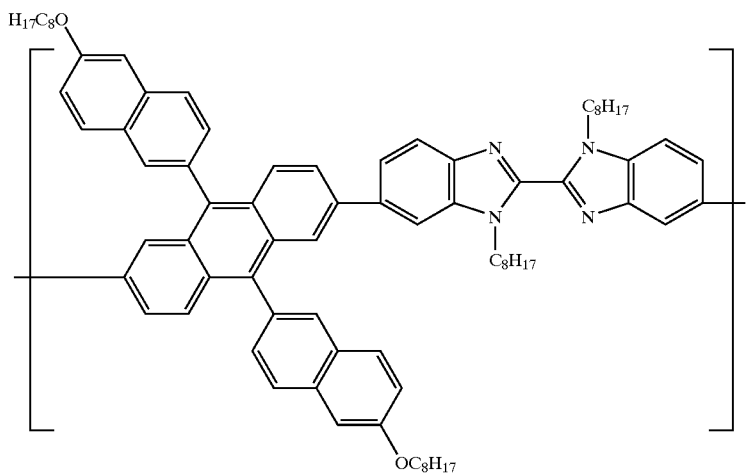
polymer 38
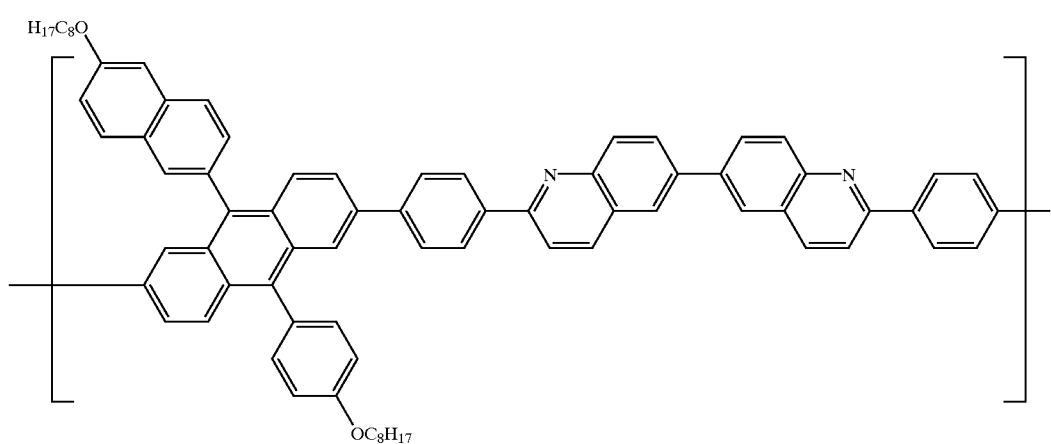
polymer 39
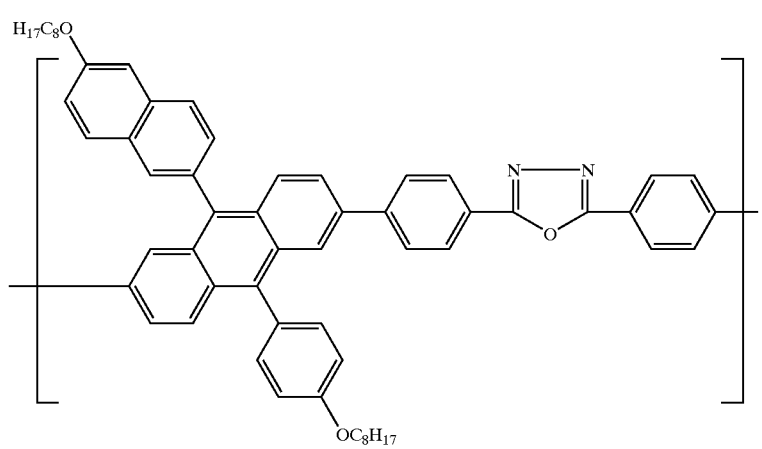
polymer 40

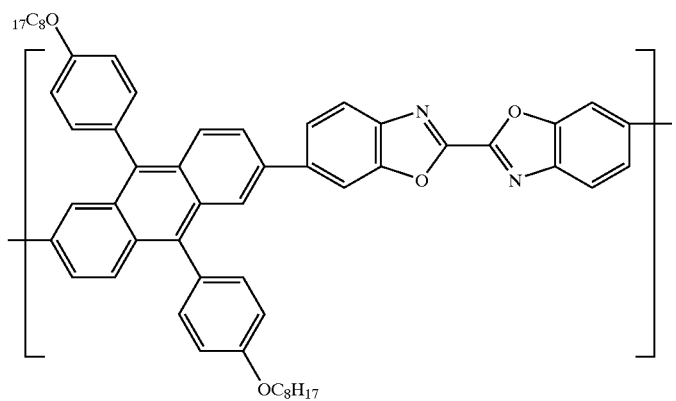
polymer 41
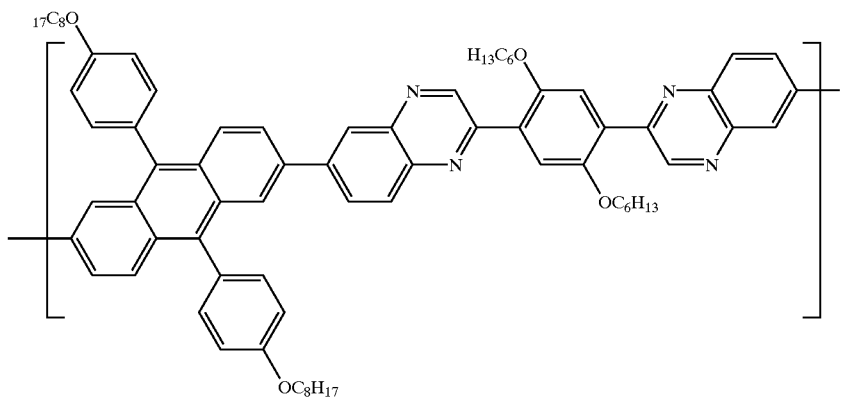
polymer 42
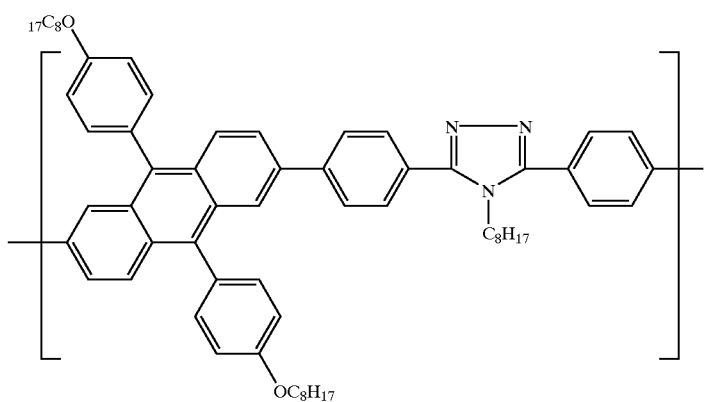
polymer 43

-continued

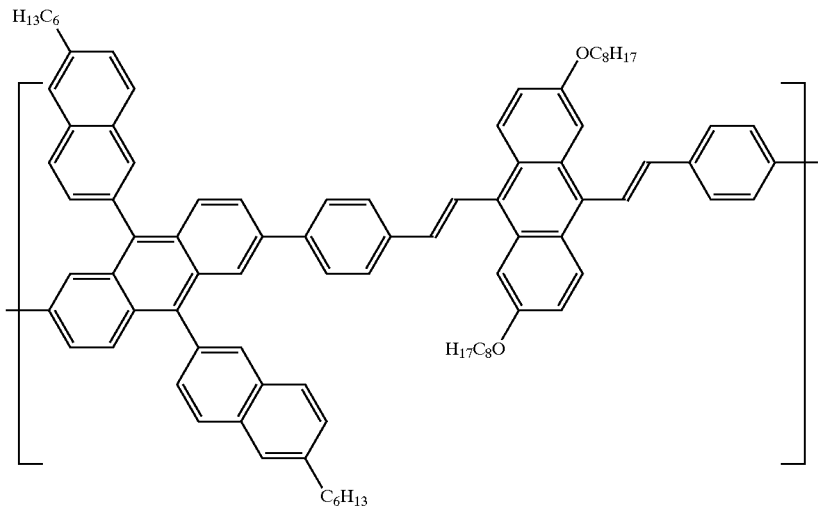

polymer 44

In formula I:

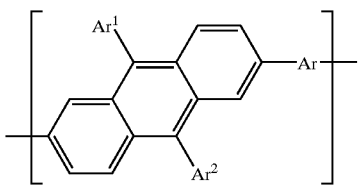

Ar can be one or the combination of more than one of the above divided groups. The specific molecular structures can be the combination of any of the above drawn structures.

The polymerization method and the molecular weights of the resulting polymers used in the present invention are illustrative only. The polymers may be prepared by condensation polymerizations, preferably by cross-coupling reactions such as the Pd-catalyzed Suzuki coupling reaction. Such a reaction was first reported by Suzuki et al on the coupling of aromatic boronic acid derivatives with aromatic halides (Suzuki, A. et al *Synthetic Comm.* 1981, 11(7), 513). A modified process was reported by Inbasekaran et al to prepare conjugated polymers for EL devices (Inbasekaran, M. et al U.S. Pat. No. 5,777,070). According to the present invention, the above mentioned polymers were prepared by Suzuki coupling reaction of an aromatic diboronic acid ester with an aromatic dibromide. The synthetic schemes for polymers and monomers are illustrated in Schemes 1–3.

FIG. 1 illustrates the basic structure used to construct organic EL devices. It is a bi-layer structure including a hole transport layer 30 and an electron transport layer 40. The electron transport layer 40 is also the emissive layer from which electroluminescence originates. Together they form the EL medium 50. The anode layer 20 is adjacent to the hole transport layer 30 and the cathode 60 is adjacent to the electron transport layer 40. The substrate is layer 10. This figure is for illustration only and the individual layer thickness is not scaled according to the actual thickness.

Figure 2:
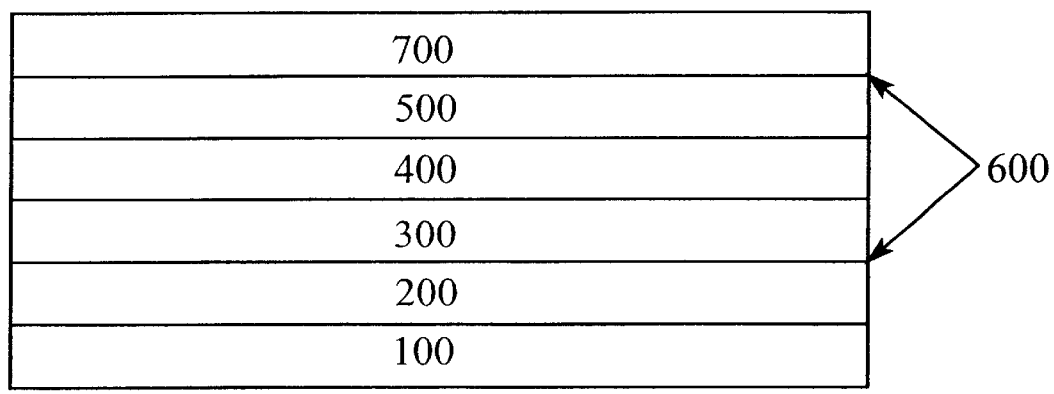
FIG. 2 illustrates a cross-section of a modified bi-layer EL device which can use a polymer in accordance with the present invention.

FIG. 2 illustrates an alternative construction of the EL device. It is a modified bi-layer structure. The EL medium contains an emissive layer between the hole transport layer and the electron transport layer. This emissive layer is the layer where electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

The bi-layer EL devices are the basic structure providing high luminous efficiency and low operating voltage. Alternative EL device structures have been demonstrated to provide improved device performance. These alternative structures include features in addition to the basic bi-layer structure such as the following structure a) hole injection layer as disclosed in the commonly-assigned U.S. Pat. No. 4,356,429; b) cathode modification with alkaline or alkaline halides as disclosed in the commonly-assigned U.S. Pat. No. 5,776,622; c) anode modification with plasma-deposited fluorocarbons as disclosed in commonly-assigned U.S. patent application Ser. No. 09/191,705; and d) doped emitter layer inserted between the hole transport and electron transport layer as disclosed in the commonly-assigned U.S. Pat. No. 4,769,292.

Figure 3:
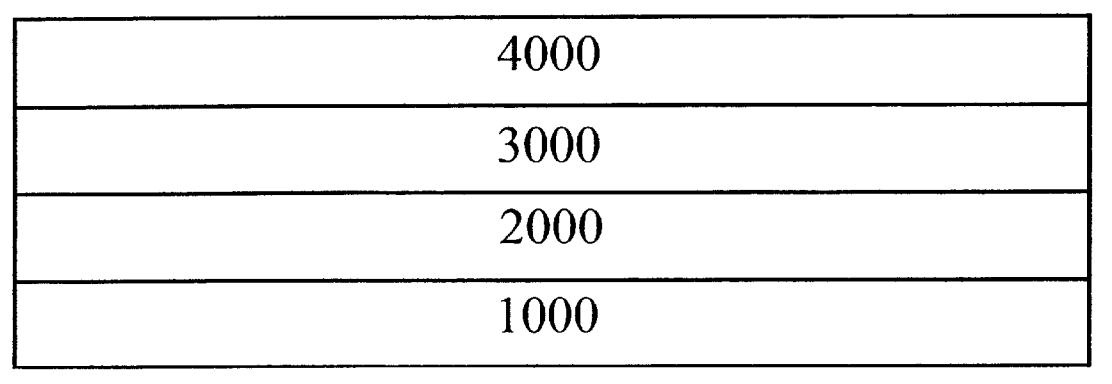

FIG. 3 illustrates another alternative construction of an EL device. It is a single-layer structure comprising an emitting layer 3000, sandwiched between an anode 2000 and a cathode 4000. The emitting layer 3000 also acts as a charge carrier layer. Thus, single layer 3000 is the electroluminescent medium. The substrate is layer 1000. This figure is for illustration only and the individual layer thickness is not scaled according to the actual thickness.

A preferred EL device structure of this invention is a single-layer structure including an anode, a cathode, and single layer of electroluminescent medium. This electroluminescent layer is the emissive layer, and is also capable of transporting electrons as well as holes. The principal function of this layer is to provide efficient emissive centers for electroluminescence. This layer can include one of the above-mentioned polymers or the blend of two or more polymers; or polymers doped with one or more fluorescent dyes (FD), phosphorescent materials, or other light-emitting material; or the above-mentioned polymers used as dopants for other EL materials; or the above-mentioned polymers finely distributed in a non-EL polymer, such as in the matrix of a thermoplastic polymer. Such distribution can improve the processing and physical properties of the polymers.

The fluorescent dye is usually present in an amount on the order of a few molar percent or less of the host polymer and it is sufficient to cause the EL emission to be predominantly that of the fluorescent dye. Using this method, highly efficient EL devices can be constructed. Simultaneously, the color of the EL devices can be tuned using fluorescent dyes of different emission wavelengths. By using a mixture of fluorescent dyes, EL color characteristics of the combined spectra of the individual fluorescent dyes are produced. This dopant scheme has been described in considerable detail for EL devices in the commonly-assigned U.S. Pat. No. 4,769,292. An important criterion for choosing a fluorescent dye as a dopant capable of modifying the hue of light emission when present in a host material is a comparison of their energy bandgap. For efficient energy transfer from the host to the dopant molecule, a necessary condition is that the energy band gap of the dopant is smaller than that of the host polymer. For efficient energy transfer from the host to phosphorescent dopants, the criterion is that the triplet energy of the host is larger than that of the dopants. Preferred fluorescent dyes used as the dopant in the emissive layer include but are not limited to coumarins, stilbenes, distrylstibenes, anthracene derivatives, tetracene, perlenes, rhodamines, and arylamines. Preferred phosphorescent dopants include but are not limited to organometallic iridium, platinum, palladium, or osmium compounds.

The molecular structures of the preferred fluorescent dyes for the emissive layer in the EL device are listed as follows:

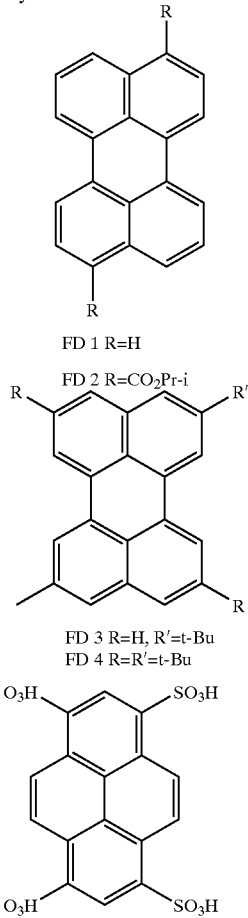

FD 1 R=H
FD 2 R=CO$_2$Pr-i

FD 3 R=H, R'=t-Bu
FD 4 R=R'=t-Bu

FD 5

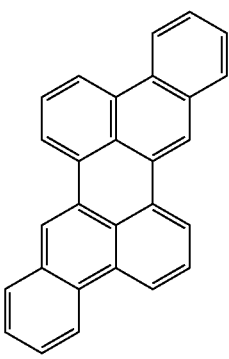

FD 6

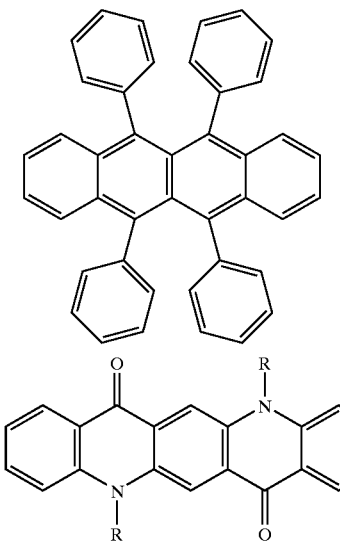

FD 7

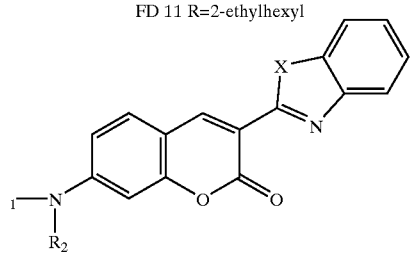

FD 8 R=H
FD 9 R=Me
FD 10 R=Pr-i
FD 11 R=2-ethylhexyl

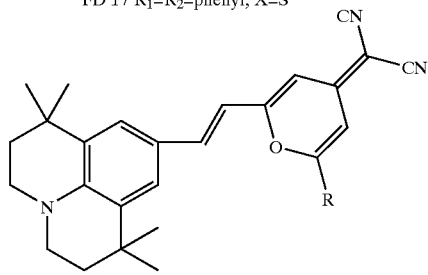

FD 12 R$_1$=R$_2$=Me, X=O
FD 13 R$_1$=R$_2$=hexyl, X=O
FD 14 R$_1$=R$_2$=phenyl, X=O
FD 15 R$_1$=R$_2$=Me, X=S
FD 16 R$_1$=R$_2$=hexyl, X=S
FD 17 R$_1$=R$_2$=phenyl, X=S FD 18 R=n-hexyl
FD 19 R=phenyl The above-mentioned polymers can be deposited as high quality transparent thin films by spin-coating or inkjet printing the polymer solutions. Preferably, the spin-coating technique is used to form layer 3000, and preferably, only one polymer is deposited as single layer of electroluminescent medium.

Preferred materials for use in forming the anode modified with fluorocarbons are disclosed in commonly-assigned U.S. patent application Ser. No. 09/191,705. The anode can also be modified by a conducting polymer such as poly(3, 4-ethylene dioxythiphene) (PEDOT) (Groenendaal, L. et al. *Adv. Mater.* 2000, 12, 481). Preferred materials for use in forming the cathode of the EL devices of this invention are Mg, Li, or alloys of these materials as disclosed in U.S. Pat. No. 5,429,884 (Namiki, et al.) and the commonly-assigned U.S. Pat. No. 5,776,622.

EXAMPLES

The invention and its advantages are further illustrated by the following specific examples:

Monomers to be used in the present invention are illustrative only. Any monomers can be used as long as the polymer formed satisfies the general formula:

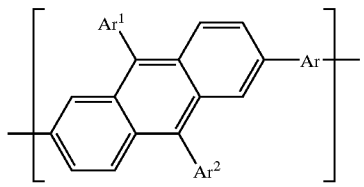

Typical monomer and polymer synthesis is illustrated in Schemes 1–3.

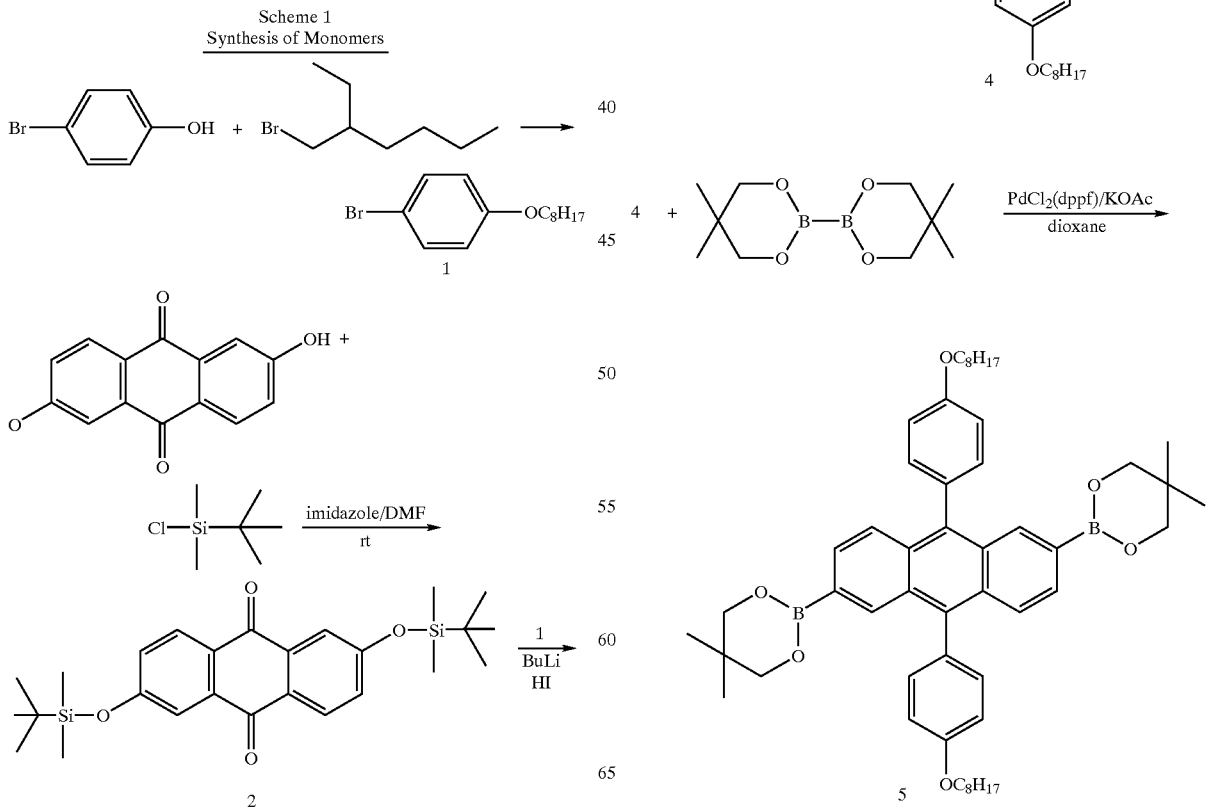

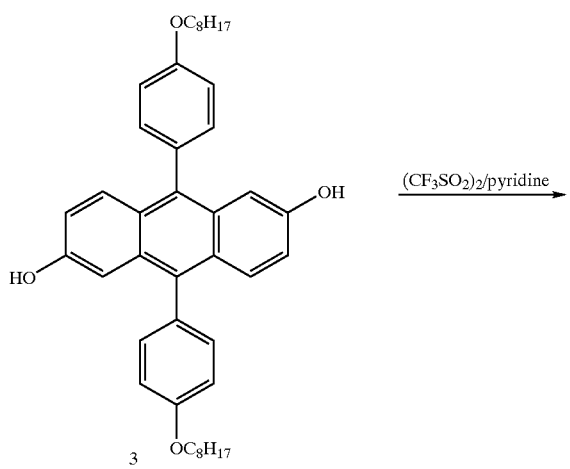

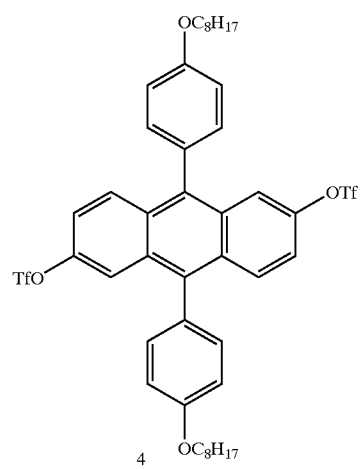

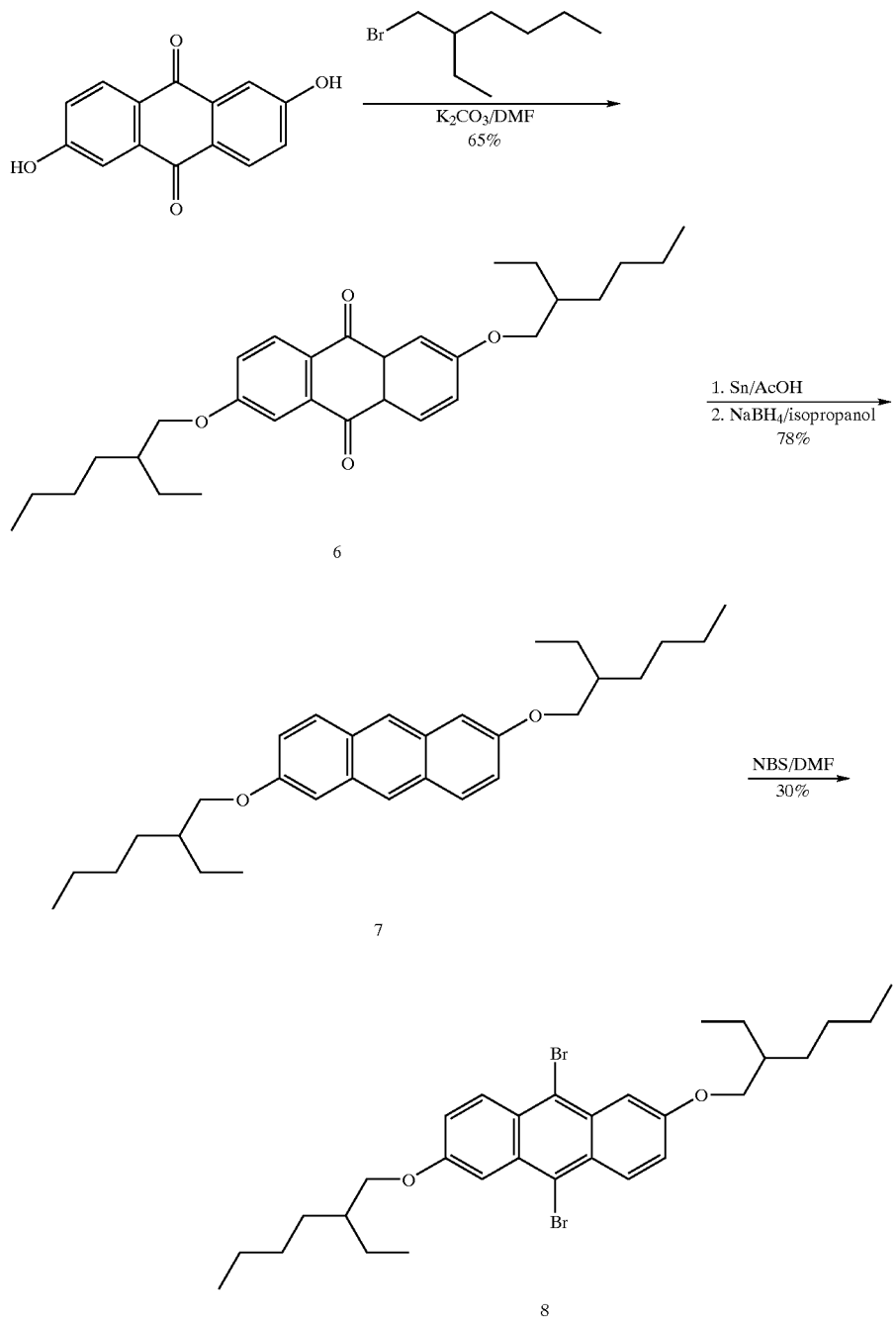

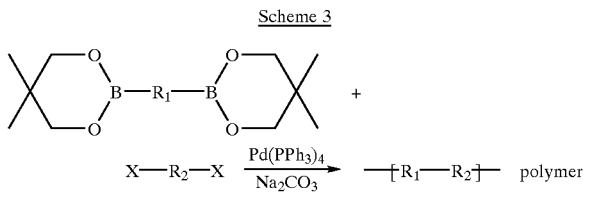

X = Br or Triflate

Example 1

Synthesis of 4-(2-ethylhexyloxy)-bromobenzene (compound 1)

To a 1-L round-bottomed flask were added 4-bromophenol (60.0 g, 0.35 mol), potassium carbonate (52.7 g, 0.38 mol), 2-ethylhexyl bromide (73.7 g, 0.38 mol) and DMF 200 mL. The reaction mixture was stirred at 90° C. under nitrogen overnight. The reaction was poured into water and extracted with ether three times and the combined organic phase was washed with water three times and dried over $MgSO_4$. After solvent was removed, the crude product was obtained as light brown liquid. Pure product was obtained by column chromatography on silica gel using ether/hexane (10/90) as an eluent to give 71.2 g of light yellow liquid at 72% yield. $^1$H NMR (CDCl$_3$)δ (ppm): 0.88–0.93 (m, 6 H, CH$_3$), 1.27–1.46 (m, 8 H), 1.65–1.74 (m, 1 H), 3.78 (d, J=5.7 Hz, 2 H, OCH$_2$), 6.76 (d, J=8.9 Hz, 2 H), 7.33 (d, J=8.9 Hz, 2 H). $^{13}$C NMR (CDCl$_3$): 11.08, 14.08, 23.03, 23.80, 29.05, 30.46, 39.29, 70.72, 112.42, 116.29, 132.11, 158.47. FD-MS: m/z 285 (M$^+$).

Example 2

Synthesis of 2,6-bis(t-butyldimethylsilyloxy) anthraquinone (compound 2)

To a 2-L round-bottomed flask were added 2,6-dihydroxyanthraquinone (80.0 g, 0.33 mol), imidazole (108.8 g, 1.6 mol), t-butyldimethylsilyl chloride (115.5 g, 0.77 mol), and DMF 600 mL. The dark red mixture was heated to 90° C. for 3 h. TLC indicated the completion of the reaction. The reaction was cooled down and poured into 2 L of cool water. The dark green needle like precipitate was filtered off and washed with water and methanol. The dark green crystals were dissolved in ether and the black insoluble part was filtered off. The bright yellow filtrate was concentrated and the crude product was suspended in boiling methanol. The yellow precipitated was filtered to give pure 85.1 g product as yellow silky crystals at 54% yield. $^1$H NMR (CDCl$_3$)δ (ppm): 0.28 (s, 12H), 1.00 (s, 18 H), 7.14 (dd, J$_1$=8.5 Hz, J$_2$=2.5 Hz, 2 H), 7.64 (d, J=2.5 Hz, 2 H), 8.17 (d, J=8.5 Hz, 2 H). $^{13}$C NMR (CDCl$_3$): −4.36, 25.53, 117.35, 125.34, 127.57, 129.73, 135.73, 161.26, 182.17. Mp 131–133° C. FD-MS: m/z 468 (M$^+$).

Example 3

Synthesis of 2,6-dihydroxy-9,10-di(4-(2-ethylhexyloxy)phenyl)anthracene (compound 3)

Compound 1 (18.3 g, 0.064 mol) was dissolved in 60 mL of anhydrous THF and cooled to −78° C. To this solution was added n-BuLi (2.5 M in hexane, 25.6 mL, 0.064 mol) slowly to maintain the temperature below −60° C. After addition, the orange-yellow solution was stirred at −78° C. for an hour. Compound 2 (10.0 g, 0.021 mol) was dissolved in 30 mL of anhydrous THF and added dropwise to the above cooled solution. TLC analysis indicated the completion of the reaction after 3 h. The reaction was warmed up slightly and HI solution (47% in water, 39 mL, 0.21 mol) was added slowly to quench the reaction and to de-protect the TBDMS group. The deep brown reaction was heated to reflux for 10 min. and most of the solvent was removed under reduced pressure. The reaction mixture was then extracted with methylene chloride three times. The combined organic phase was washed with saturated sodium metabisulfate solution, water, and brine, and dried over MgSO$_4$. The crude product was obtained as brown viscous oil and was purified by column chromatography on silica gel with 15/85 ether/hexane as an eluent. The pure product was obtained as 5.5 g of light green-yellow solid at 42% yield. $^1$H NMR (CDCl$_3$)δ (ppm): 0.92–1.01 (m, 12 H, CH$_3$), 1.26–1.46 (m, 16 H), 1.77–1.86(m, 2 H), 3.96 (d, J=5.7 Hz, 4 H, OCH$_2$), 4.93 (s, br, 2 H, OH), 6.91 (d, J=2.3 Hz, 2 H), 6.95 (dd, J$_1$=9.5 Hz, J$_2$=2.4 Hz, 2 H), 7.09 (d, J=8.6 Hz, 4 H, phenyl), 7.31 (d, J=8.6 Hz, 4 H, phenyl), 7.60 (d, J=9.4 Hz, 2 H). $^{13}$C NMR (CDCl$_3$): 11.17, 14.13, 23.09, 23.91, 29.13, 30.58, 39.46, 70.62, 106.88, 114.49, 118.59, 127.33, 129.00, 129.93, 131.02, 132.21, 151.75, 158.72. M.p. 195–197° C. FD-MS: m/z 618 (M$^+$).

Example 4

Synthesis of 2,6-di(triflate)-9,10-di(4-(2-ethylhexyloxy)phenyl)anthracene (compound 4)

Compound 3 (4.5 g, 0.007 mol) was dissolved in 50 mL of dry pyridine and cooled to 0° C. To this brown red solution was added slowly triflate anhydride (6.2 g, 0.022 mol). The dark green reaction was stirred at room temperature for 20 min. TLC indicated the completion of the reaction. The reaction was poured into water and extracted with ether (3×200 mL). The combined organic phase was washed with 2N HCl (2×200 mL) and dried over MgSO$_4$. The crude product was purified by column chromatography on silica gel using CH$_2$Cl$_2$/hexane (10/90) to give 5.9 g of blue fluorescent yellow crystalline product at 92% yield. $^1$H NMR (CDCl$_3$)δ (ppm): 0.94–1.04 (m, 12 H, CH$_3$), 1.38–1.60 (m, 16 H), 1.81–1.88 (m, 2 H), 4.01 (d, J=5.7 Hz, 4 H, OCH$_2$), 7.16 (d, J=8.5 Hz, 4 H, phenyl), 7.25 (dd, J$_1$=9.5 Hz, J$_2$=2.4 Hz, 2 H), 7.35 (d, J=8.5 Hz, 4 H, phenyl), 7.66 (d, J=2.3 Hz, 2 H), 7.88 (d, J=9.5 Hz, 2H). M.p. 103–104° C. FD-MS: m/z 882 (M$^+$).

Example 5

Synthesis of 2,6-di(2,2-dimethyltrimethylene diboronate)-9,10-di(4-(2-ethylhexyloxy)phenyl) anthracene (compound 5)

Compound 4 (4.1 g, 0.005 mol), bis(neopentyl glycolato) diboron (2.3 g, 0.01 mol), 1,1'-bis(diphenylphosphino) ferrocene)dichloropalladium (II)/dichloromethane complex (0.23 g, 6 mol % to compound 4), 1,1'-bis (diphenylphosphino)ferrocene (0.15 g, 6 mol % to 4), and potassium acetate (2.7 g, 0.028 mol) were mixed with 50 mL of dioxane. The mixture was degassed with nitrogen for 10 min. and then heated to 80° C. overnight. The reaction was cooled and ice water 50 mL was added. Brown precipitate formed and was filtered, washed with water and hexane. The brownish yellow solid was dissolved in ether, washed with water (5×100 mL) to remove the by-product neopentyl glycol to give 3.3 g of product as light brownish yellow solid at 88% yield. $^1$H NMR (CDCl$_3$)δ (ppm): 0.94–1.04 (m, 24 H, CH$_3$), 1.21–1.43 (m, 16 H), 1.80–188 (m, 2 H), 3.72 (s, 8 H), 4.02 (d, J=5.7 Hz, 4 H, OCH$_2$), 7.14 (d, J=8.5 Hz, 4 H, phenyl), 7.38 (d, J=8.5 Hz, 4 H, phenyl), 7.62–7.70 (m, 4 H), 8.28 (s, 2 H). $^{13}$C NMR (CDCl$_3$): 11.24, 14.16, 21.95, 23.12, 23.95, 29.20, 30.64, 31.83, 39.57, 70.71, 72.24, 114.38, 126.02, 128.25, 130.20, 130.98, 131.26, 132.38, 132.49, 134.41, 134.52, 137.47, 158.59. M.p. 191–193° C. FD-MS: m/z 810 (M$^+$).

Example 6

Synthesis of 2,6-di(2-ethylhexyloxy)anthraquinone (compound 6)

2,6-Dihydroxyanthraquinone (100.0 g, 0.42 mol) and 2-ethylhexyl bromide (165.0 g, 0.86 mol) were dissolved in 1 L of DMF. To this solution was added anhydrous K$_2$CO$_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over MgSO$_4$. Solvent was removed and the crude product was recrystallized from methanol to give 125.2 g of yellow powdery product at 65% yield. $^1$H NMR (CDCl$_3$)δ (ppm): 0.92–0.98 (m, 12 H, CH$_3$), 1.34–1.54 (m, 16 H), 1.75–1.81 (m, 2 H, CH(CH$_3$)), 4.02 (d, J=5.7 Hz, 4 H, OCH$_2$), 7.19 (d, J=8.4 Hz, 2 H), 7.70 (s, 2 H), 8.19 (d, J=8.5 Hz, 2 H). $^{13}$C NMR (CDCl$_3$): 11.12, 14.06, 23.04, 23.88, 29.08, 30.51, 39.34, 71.34, 110.64, 120.84, 127.00, 129.62, 135.88, 164.29, 182.27. M.p. 49–51° C. FD-MS: m/z 464 (M$^+$).

Example 7

Synthesis of 2,6-di(2-ethylhexyloxy)anthracene (compound 7)

To a 1-L round-bottomed flask was added compound 6 (75.0 g, 0.16 mol), tin (80.0 g, 0.67 mol), and 375 mL of acetic acid. The reaction was refluxed for 2 h during which the reaction became a slurry. The reaction was cooled to room temperature and the top layer was decanted. The solid was washed with CH$_2$Cl$_2$. The combined organic phase was washed with water, saturated NaHCO$_3$ solution and brine, and dried over MgSO$_4$. Solvent was removed to yield 72.1 g of yellow solid. The yellow solid was dissolved in 200 mL of isopropanol and added dropwise to a solution of NaBH$_4$ (6.50 g, 0.17 mol) in 300 mL of isopropanol. The reaction was heated at reflux overnight. After cooled to room temperature, the reaction was quenched with dilute HCl solution and then poured into water. The yellow precipitate was collected by filtration, washed with water and ethanol and dried to give 55.2 g of pure product as yellow powder at 78% yield in two steps. $^1$H NMR (CDCl$_3$)δ (ppm): 0.92–1.62 (m, 14 H, alkyl), 1.79–1.87 (m, 1 H, alkyl), 3.99 (d, J=5.7 Hz, 2 H, OCH$_2$), 7.14 (d, J=9.4 Hz, 2 H), 7.17 (s, 2 H, 1 and 5 of anthracene), 8.17 (s, 2 H, 9 and 10 of anthracene). $^{13}$C NMR (CDCl$_3$): 11.19, 14.10, 23.10, 24.07, 29.18, 30.72, 39.44, 70.48, 104.58, 120.85, 124.09, 128.71, 129.06, 131.30, 156.22. M.p. 60–62° C. FD-MS: m/z 436 (M$^+$).

Example 8

Synthesis of 9,10-dibromo-2,6-di(2-ethylhexyloxy) anthracene (compound 8)

Compound 7 (13.5 g, 0.031 mol) was added to 150 mL of DMF and cooled down to 0° C. To this suspension was added NBS (11.60 g, 0.065 mol) in 60 mL of DMF. Upon addition of NBS, the reaction became clear and turned to dark green color. The reaction was stirred at room temperature under nitrogen overnight. The reaction was poured into 200 mL of water, and extracted with methylene chloride (3×300 mL). The combined organic phase was washed thoroughly with water (3×100 mL) and brine (1×100 mL), and dried over MgSO$_4$. After removal of the solvent, the dark brown residue was washed with hexane to collect greenish yellow crystals. The crude crystals were recrystallized from acetone to give flake like greenish yellow fluorescent product. The filtrates were combined and purified by chromatography on silica gel with hexane as eluent. The total yield of the reaction is 5.5 g at 30% yield. $^1$H NMR (CDCl$_3$)δ (ppm): 0.93–1.70 (m, 14 H, alkyl), 1.81–1.89 (m, 1 H, alkyl), 3.12 (d, J=5.4 Hz, 2 H, OCH$_2$), 7.34 (d, J=9.2 Hz, 2H), 8.00 (d, J=9.2 Hz, 2 H), 8.71 (s, 2 H, 1 and 5 of anthracene). $^{13}$C NMR (CDCl$_3$): 11.12, 14.10, 23.08, 23.93, 29.15, 30.52, 39.88, 72.76, 107.74, 117.02, 125.27, 129.51, 129.75, 130.12, 152.87. M.p. 103–105° C. FD-MS: m/z 590 (M$^+$).

Synthesis of Polymers

Example 9

Synthesis of Polymer 17

Compound 5 (0.73 g, 0.9 mmol), compound 4 (0.80 g, 0.9 mmol), and Aliquat® 336 (0.050 g, 13 mol % to compound 5) were dissolved in 4.5 mL of toluene. To this solution was added 2 M Na$_2$CO$_3$ aqueous solution (1.5 mL, 3.0 mmol). The reaction mixture was bubbled with dry nitrogen for 15 min and catalyst tetrakis(triphenylphosphine)palladium (40 mg, 3 mol % to compound 5) was added. The reaction was heated under vigorous reflux for 24 h, and small amount of phenylboronic acid was added for end-capping of bromo group. The reaction was heated for 13 h and bromobenzene was added to end-cap boronate group. The reaction was heated for another 6 h and then poured into 60 mL of methanol. The precipitated polymer was washed with methanol, diluted HCl solution, and dried to give light yellow polymer 0.82 g at 7% yield. The polymer was then extracted with acetone with a Soxhlet setup overnight to remove oligomer and residual catalyst. Polymer was re-precipitated from chloroform into methanol three times to give final polymer 0.80 g. Size exclusion chromatography (SEC) (in THF with polystyrene as standard) analysis indicates that the polymer has a weight average molecular weight (Mw) of 9390 and a polydispersity of 1.78. Thermal analysis indicates that polymer has a thermal onset decomposition temperature 435° C., and no glass transition temperature was observed before 435° C.

Example 10

Synthesis of Polymer 20

The procedure used to prepare polymer 17 was followed. Compound 5 (1.50 g, 1.85 mmol), compound 2 (1.10 g, 1.85 mmol), and Aliquat® 336 (0.10 g) were dissolved in 9.5 mL of toluene. To this solution were added 2 M Na$_2$CO$_3$ aqueous solution (3.1 mL, 6.2 mmol) and catalyst tetrakis (triphenylphosphine)palladium (80 mg). After polymerization and purification 1.18 g of light yellow polymer was obtained. The polymer has a Mw of 8420 and a polydispersity of 1.59. Thermal analysis indicates that polymer has a thermal onset decomposition temperature 395° C., and no glass transition temperature was observed before 395° C.

Example 11

Synthesis of Polymer 4

The procedure used to prepare polymer 17 was followed. Compound 4 (0.85 g, 1.05 mol), 4,4'-biphenyl diboronate (0.36 g, 1.05 mmol), and Aliquat® 336 (0.05 g) were dissolved in 5 mL of toluene. To this solution were added 2 M Na$_2$CO$_3$ aqueous solution (1.6 mL, 3.2 mmol) and tetrakis(triphenylphosphine)palladium catalyst (36 mg). After polymerization and purification 0.30 g of light yellow polymer was obtained.

EL Device Fabrication and Performance

Example 12

An EL device satisfying the requirements of the invention was constructed in the following manner. The organic EL medium has single layer of polymer thin film.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P from Bayer Corp.) was spin-coated onto ITO under a controlled spinning speed to obtain thickness of 500 Angstroms. The coating was baked in an oven at 120° C. for 20 min.

c) A toluene solution of a polymer (30 mg in 30 mL of solvent) was filtered through a 0.2 μm Teflon filter. The polymer solution was then spin-coated onto PEDOT under a controlled spinning speed. The thickness of the polymer film was between 500–700 Angstroms.

d) On the top of the polymer film was deposited a cathode layer of 2000 Angstroms thick consisting of a 10:1 atomic ratio of Mg and Ag.

The above sequence completed the deposition of the EL device. The device was then hermetically packaged in a dry glove box for protection against ambient environment.

Figure 4:
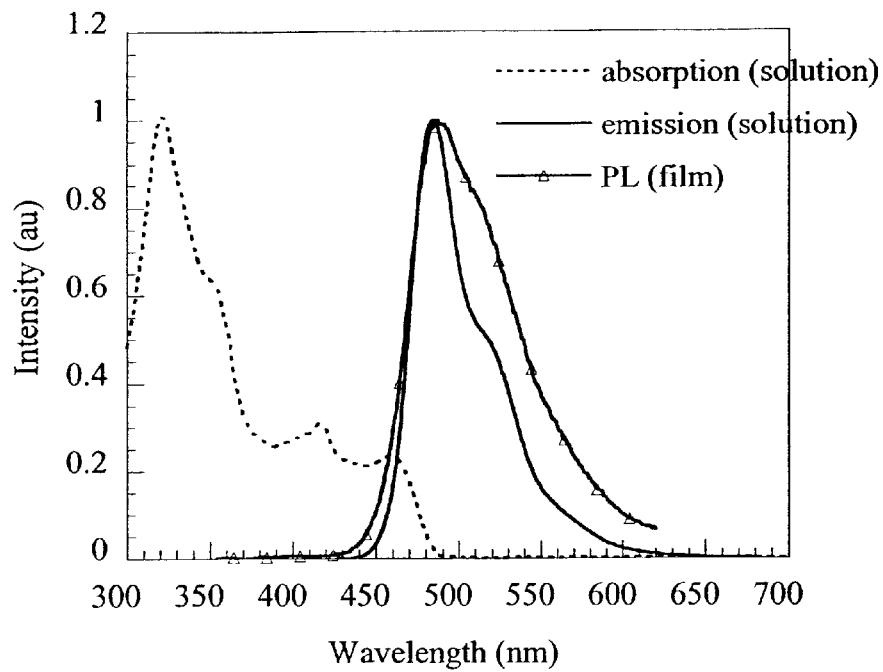
FIG. 4 illustrates the absorption, emission, and photoluminescence spectra of polymer 17.
Figure 5:
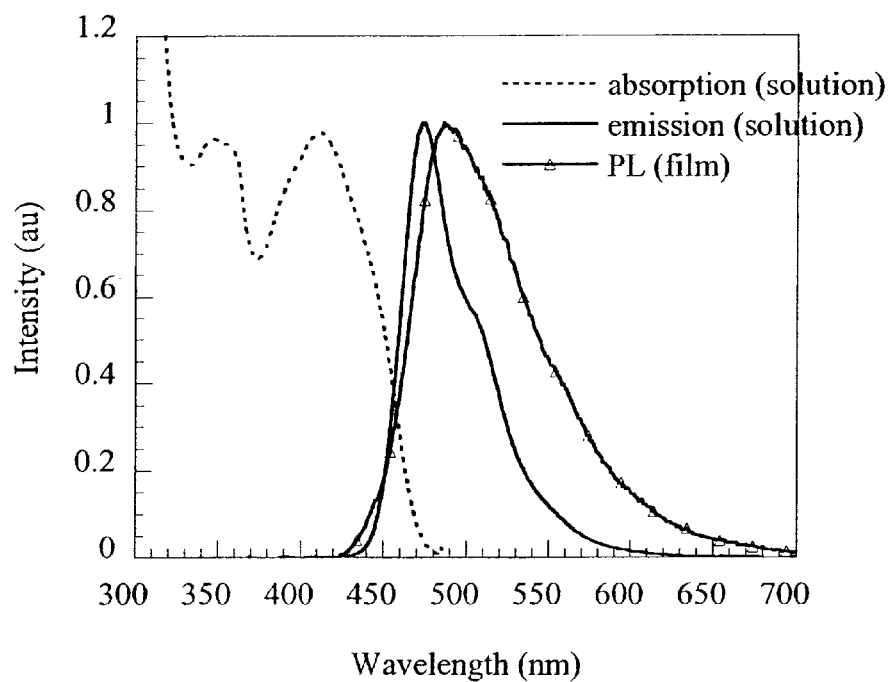
FIG. 5 illustrates the absorption, emission, and photoluminescence spectra of polymer 20.
Figure 6:
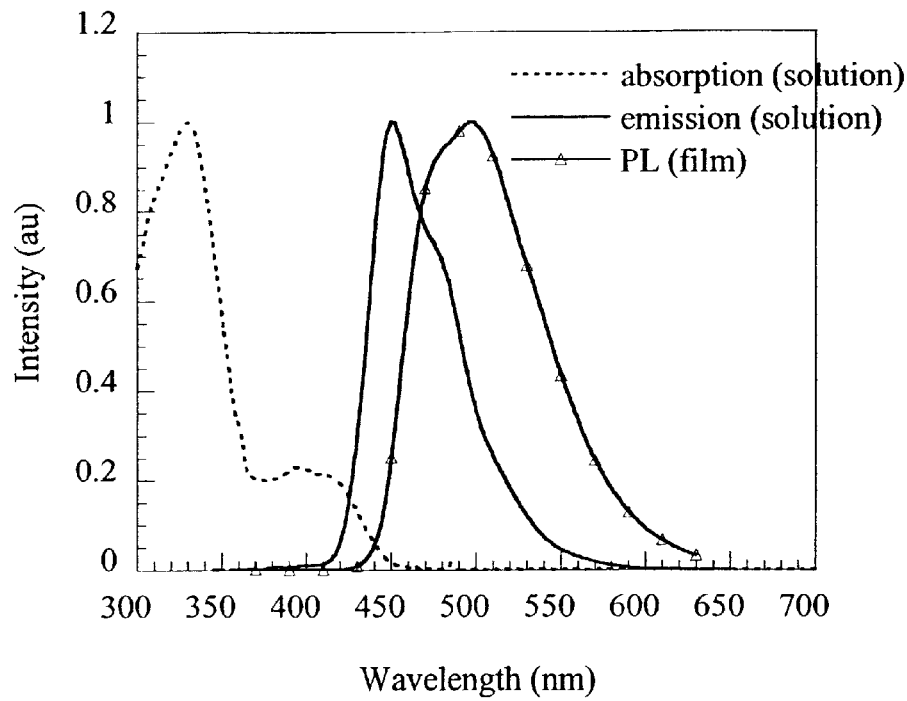
FIG. 6 illustrates the absorption, emission, and photoluminescence spectra of polymer 4.
Figure 7:
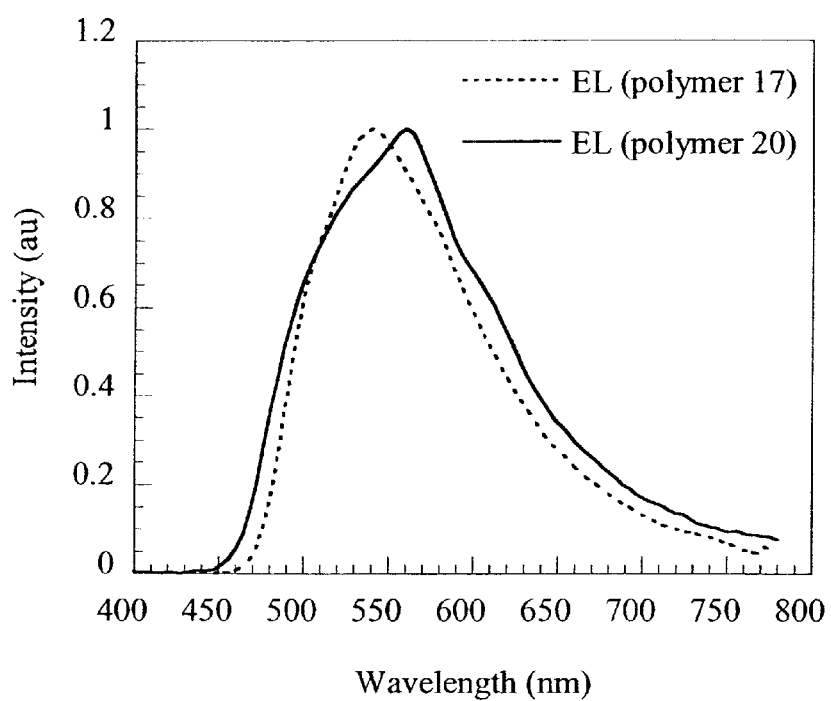
FIG. 7 illustrates the electroluminescence spectra of single-layer EL device fabricated from polymers 17 and 20.

FIGS. 4, 5 and 6 show the absorption, emission, and PL spectra of polymers 17, 20 and 4 respectively. EL spectra of device fabricated from polymer 17 and 20 are shown in FIG. 7. Absorption and emission spectra were obtained from dilute toluene solutions, photoluminescence (PL) spectra from solid thin films of the polymers, and EL spectra were obtained from ITO(PEDOT)/polymer/Mg:Ag EL devices.

The invention has been described in detail with particular reference to certain preferred embodiments thereof, but it will be understood that variations and modifications can be effected within the spirit and scope of the invention.

PARTS LIST 10 substrate
20 anode
30 hole transport layer
40 electron transport layer
50 EL medium
60 cathode
100 substrate
200 anode
300 hole transport layer
400 emissive layer
500 electron transport layer
600 EL medium
700 cathode
1000 substrate
2000 anode
3000 emitting layer
4000 cathode

What is claimed is:

1. An electroluminescent device comprises an anode, a cathode, and an emissive layer having a polymer luminescent material disposed between the anode and cathode, the polymer luminescent material includes diarylanthracene-based conjugated polymer having a repeating unit of the following formula:

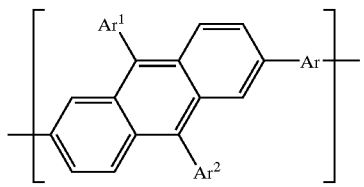

wherein:

$Ar^1$, $Ar^2$, and Ar are each individually aryl or substituted aryl of from 6 to 40 carbon atoms; or $Ar^1$, $Ar^2$, and Ar are each individually substituted heteroaryl or unsubstituted heteroaryl having 4 to 40 carbons.

2. The electroluminescent device of claim 1 wherein Ar represents:

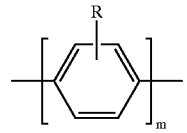

wherein: R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom; and m is an integer from 1 to 3.

3. The electroluminescent device of claim 1 wherein Ar represents:

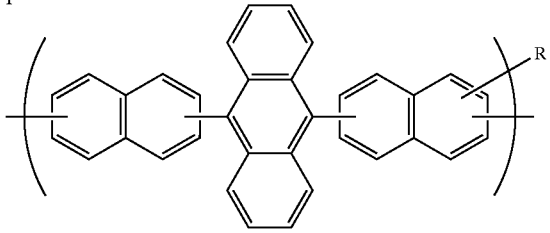

wherein: R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

4. The electroluminescent device of claim 1 wherein Ar represents:

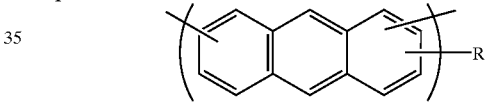

wherein: R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

5. The electroluminescent device of claim 1, wherein:

$Ar^1$ and $Ar^2$ individually represent

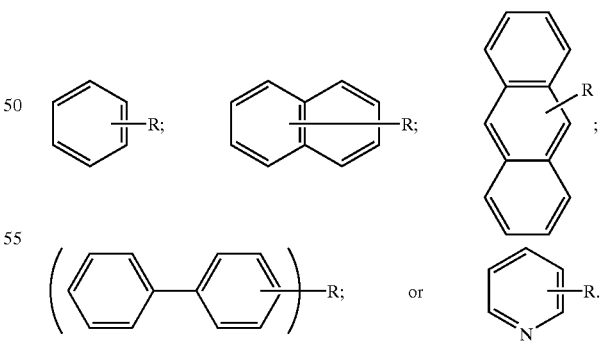

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

6. The electroluminescent device of claim 1 wherein Ar represents:

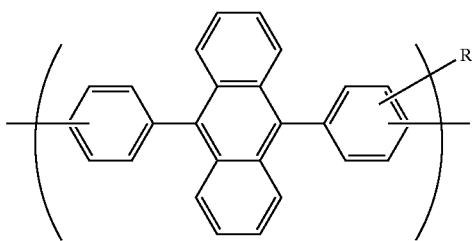

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

7. The electroluminescent device of claim 1 wherein Ar represents:

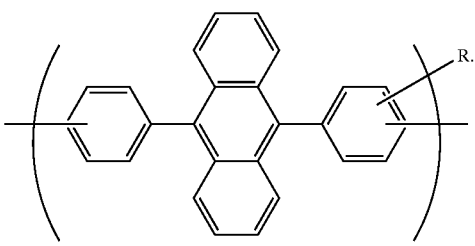

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

8. The electroluminescent device of claim 1 wherein Ar represents:

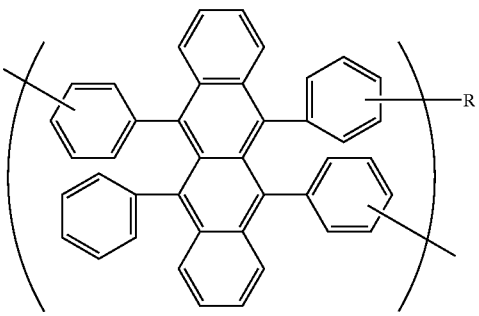

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

9. The electroluminescent device of claim 1 wherein Ar represents:

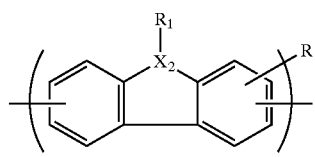

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

$R_1$ is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons; and $X_2$ is a nitrogen or carbon atom.

10. The electroluminescent device of claim 1, wherein Ar represents:

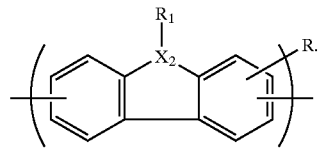

wherein $R_1$ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons; and $X_2$ is a nitrogen or carbon atom.

11. The electroluminescent device of claim 1 wherein Ar represents:

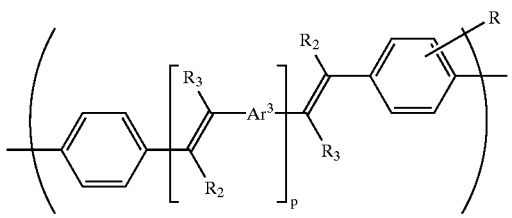

wherein
$Ar^3$ is the same as Ar;
$R_2$ and $R_3$ are independently hydrogen, alkyl group of from 1 to 24 carbon atoms, or aryl or substituted aryl of from 6 to 28 atoms, or heteroaryl or substituted heteroaryl of from 4 to 40 atoms, or a cyano group; and R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom.

12. The electroluminescent device of claim 1, wherein Ar represents:

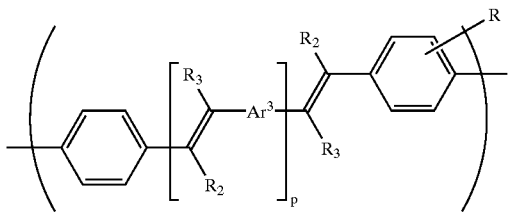

wherein
$Ar^3$ is the same as Ar; and
$R_2$ and $R_3$ are independently hydrogen, alkyl group of from 1 to 24 carbon atoms, or aryl or substituted aryl of from 6 to 28 atoms, or heteroaryl or substituted heteroaryl of from 4 to 40 atoms, or a cyano group.

13. The electroluminescent device of claim 1 wherein Ar is:

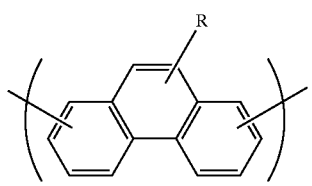

wherein R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

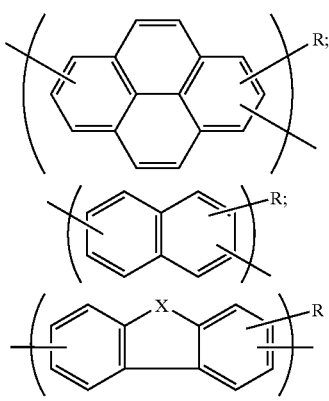

wherein
X is an O or S atom;

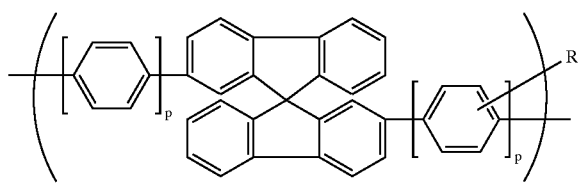

wherein p is an integer from 0 to 2;

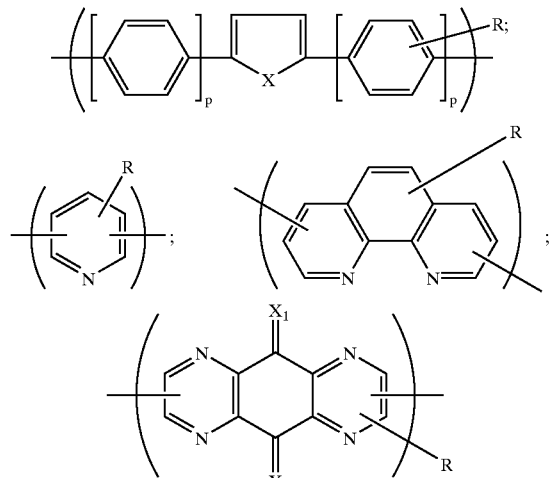

wherein: $X_1$ is an O atom or two cyano groups;

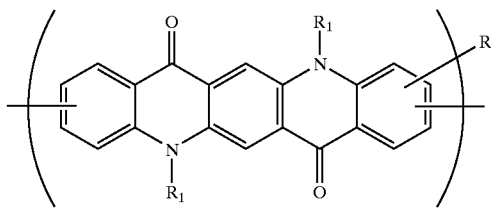

wherein $R_1$ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons;

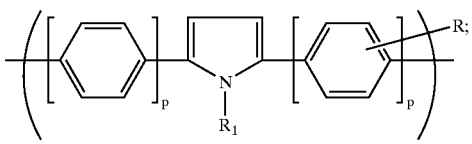

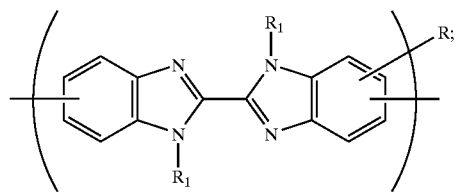

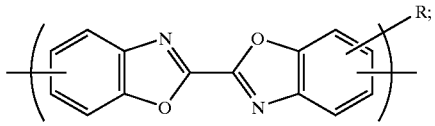

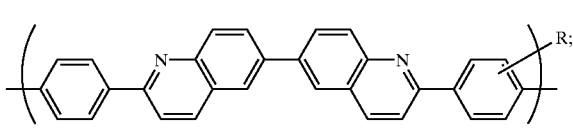

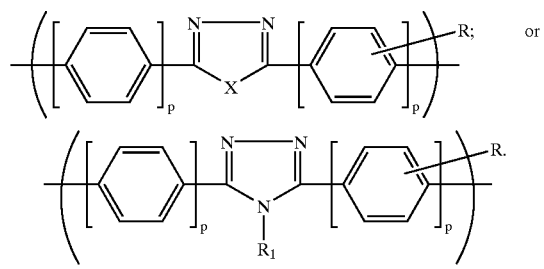

14. The electroluminescent device of claim 1 wherein Ar is:

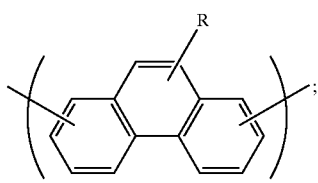

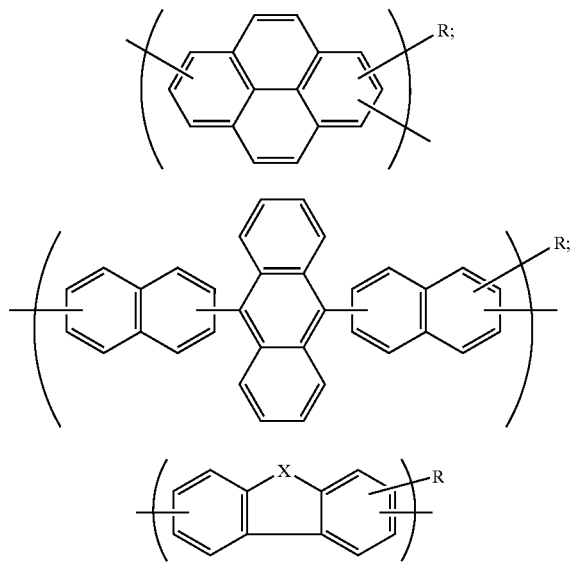
wherein
  X is an O or S atom;
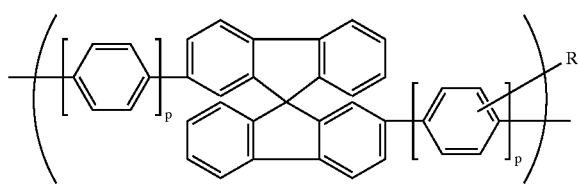
wherein p is an integer from 0 to 2;
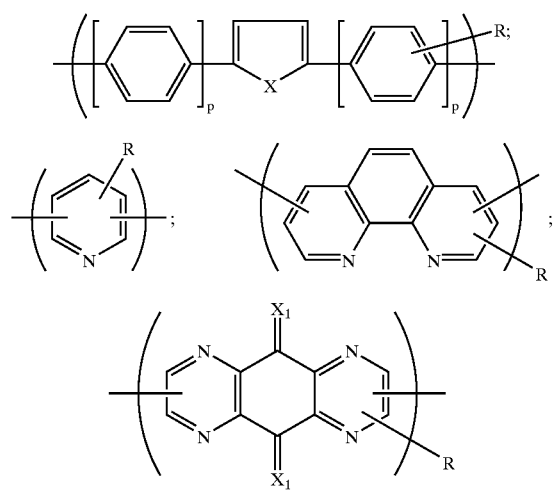
wherein $X_1$ is an O atom or two cyano groups;
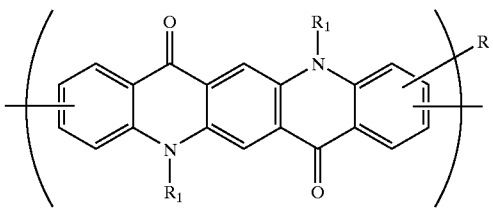
wherein $R_1$ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons;
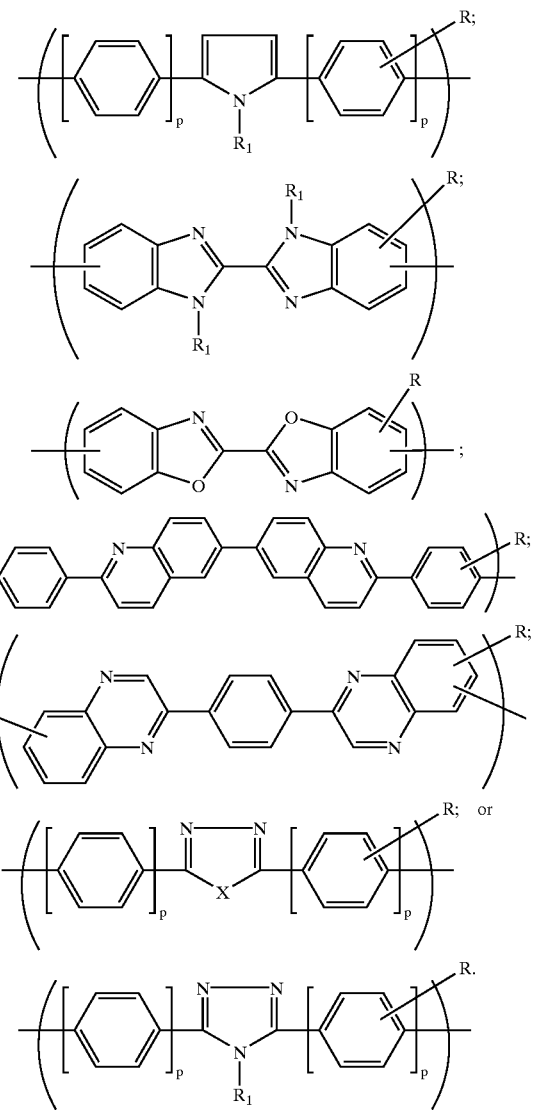
* * * * *